United States Patent
Hong et al.

(10) Patent No.: US 12,245,461 B2
(45) Date of Patent: Mar. 4, 2025

(54) DISPLAY APPARATUS

(71) Applicant: Samsung Display Co., Ltd., Yongin-si (KR)

(72) Inventors: Sungjin Hong, Yongin-si (KR); Chungsock Choi, Yongin-si (KR); Juhoon Kang, Yongin-si (KR); Joohee Jeon, Yongin-si (KR); Sunyoung Jung, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 301 days.

(21) Appl. No.: 17/666,478

(22) Filed: Feb. 7, 2022

(65) Prior Publication Data
US 2022/0285456 A1 Sep. 8, 2022

(30) Foreign Application Priority Data

Mar. 5, 2021 (KR) .................. 10-2021-0029658

(51) Int. Cl.
| | | |
|---|---|---|
| H10K 59/121 | (2023.01) | |
| H10K 50/813 | (2023.01) | |
| H10K 50/86 | (2023.01) | |
| H10K 59/122 | (2023.01) | |
| H10K 59/123 | (2023.01) | |
| H10K 59/131 | (2023.01) | |
| H10K 59/38 | (2023.01) | |

(Continued)

(52) U.S. Cl.
CPC ......... *H10K 59/121* (2023.02); *H10K 50/813* (2023.02); *H10K 50/865* (2023.02); *H10K 59/122* (2023.02); *H10K 59/123* (2023.02); *H10K 59/131* (2023.02); *H10K 59/38* (2023.02); *H10K 59/40* (2023.02); *H10K 59/65* (2023.02)

(58) Field of Classification Search
CPC ....................... H10K 59/121; H10K 50/813
See application file for complete search history.

(56) References Cited

U.S. PATENT DOCUMENTS

| | | | |
|---|---|---|---|
| 10,388,913 | B2 | 8/2019 | Jung et al. |
| 10,453,905 | B2 | 10/2019 | An et al. |
| 10,541,294 | B2 | 1/2020 | Hong et al. |

(Continued)

FOREIGN PATENT DOCUMENTS

| | | |
|---|---|---|
| CN | 111725285 | 9/2020 |
| CN | 111769147 | 10/2020 |

(Continued)

*Primary Examiner* — Matthew L Reames
(74) *Attorney, Agent, or Firm* — KILE PARK REED & HOUTTEMAN PLLC

(57) ABSTRACT

A display apparatus includes: a substrate including a main display area, a component area, and a peripheral area; a main pixel circuit and a main display element connected to the main pixel circuit, the main pixel circuit and the main display element being disposed on the main display area; an auxiliary display element disposed on the component area; an auxiliary pixel circuit arranged on the peripheral area; and a connection line connecting the auxiliary display element to the auxiliary pixel circuit. The auxiliary display element includes an auxiliary pixel electrode that is at least partially round. The auxiliary pixel electrode has an asymmetrical shape with a contact portion at one side thereof. The contact portion is connected to the connection line.

29 Claims, 24 Drawing Sheets

(51) Int. Cl.
   *H10K 59/40*   (2023.01)
   *H10K 59/65*   (2023.01)

(56) References Cited

U.S. PATENT DOCUMENTS

| | | | |
|---|---|---|---|
| 10,854,690 B2 | 12/2020 | Bae et al. | |
| 2016/0163780 A1* | 6/2016 | Park | H01L 27/1255 257/40 |
| 2021/0384266 A1* | 12/2021 | Zhao | H10K 59/131 |
| 2021/0405260 A1 | 12/2021 | He et al. | |

FOREIGN PATENT DOCUMENTS

| | | |
|---|---|---|
| CN | 111816788 | 10/2020 |
| KR | 1020180061853 | 6/2018 |
| KR | 10-2018-0128545 | 12/2018 |
| KR | 10-2018-0131679 | 12/2018 |
| KR | 10-2019-0062678 | 6/2019 |
| KR | 10-2020-0099251 | 8/2020 |

\* cited by examiner

DISPLAY APPARATUS

CROSS-REFERENCE TO RELATED APPLICATIONS

This application claims priority to and the benefit of Korean Patent Application No. 10-2021-0029658, filed Mar. 5, 2021, which is hereby incorporated by reference for all purposes as if fully set forth herein.

BACKGROUND

Field

One or more embodiments generally relate to a display apparatus, and, more particularly, to a display apparatus in which quality of an image output through a component is improved while a high-quality image is provided.

Discussion

Display apparatuses typically include a display element and electronic elements for controlling an electrical signal applied to the display element. The electronic elements may include a thin-film transistor (TFT), a storage capacitor, and a plurality of wires. Also, the use of display apparatuses has diversified. As thicknesses and weights of display apparatuses have decreased, the range of applications of display apparatuses has increased. As the range of use of display apparatuses has diversified, various methods of designing the shapes of the display apparatuses have been studied.

The above information disclosed in this section is only for understanding the background of the inventive concepts, and, therefore, may contain information that does not form prior art.

SUMMARY

In a conventional display panel and a display apparatus including the same, display quality may deteriorate when an image is captured with a camera in a design process for displaying a high-quality image. To solve various problems including the above problem, one or more embodiments are capable of providing a display apparatus in which quality of an image output through a component is improved while a high-quality image is provided.

Additional aspects will be set forth in the detailed description which follows, and, in part, will be apparent from the disclosure, or may be learned by practice of the inventive concepts.

According to one or more embodiments, a display apparatus includes a substrate, a main pixel circuit, a main display element, an auxiliary display element, an auxiliary pixel circuit, and a connection line. The substrate includes a main display area, a component area, and a peripheral area. The main display element is connected to the main pixel circuit. The main pixel circuit and the main display element are disposed on the main display area. The auxiliary display element is disposed on the component area. The auxiliary pixel circuit is disposed on the peripheral area. The connection line connects the auxiliary display element to the auxiliary pixel circuit. The auxiliary display element includes an auxiliary pixel electrode that is at least partially round. The auxiliary pixel electrode has an asymmetrical shape with a contact portion at one side thereof. The contact portion is connected to the connection line.

According to one or more embodiments, a display apparatus includes a substrate, a main pixel circuit, a main display element, an auxiliary display element, an auxiliary pixel circuit, a connection line, and a metal layer. The substrate includes a main display area, a component area, and a peripheral area. The main display element is connected to the main pixel circuit. The main pixel circuit and the main display element are disposed on the main display area. The auxiliary display element is disposed on the component area. The auxiliary display element includes an auxiliary pixel electrode. The auxiliary pixel circuit is disposed on the peripheral area. The connection line connects the auxiliary display element to the auxiliary pixel circuit. The metal layer is between the substrate and the auxiliary display element. The metal layer overlaps the auxiliary display element. At least a portion of the metal layer has a round shape.

According to one or more embodiments, a display apparatus includes a substrate, a main pixel circuit, a main display element, an auxiliary display element, an auxiliary pixel circuit, a connection line, and an optical functional layer. The substrate includes a main display area, a component area, and a peripheral area. The main display element is connected to the main pixel circuit. The main pixel circuit and the main display element are disposed on the main display area. The auxiliary display element is disposed on the component area. The auxiliary display element includes an auxiliary pixel electrode. The auxiliary pixel circuit is disposed on the peripheral area. The connection line connects the auxiliary display element to the auxiliary pixel circuit. The optical functional layer overlaps the main display element and the auxiliary display element. The optical functional layer further includes a black matrix and a color filter layer. The black matrix includes an opening corresponding to the auxiliary display element. The color filter layer is arranged to correspond to the opening. At least a portion of an outer portion of the black matrix has a round shape.

According to one or more embodiments, a display apparatus includes a display apparatus includes a substrate, a main pixel circuit, a main display element, an auxiliary display element, an auxiliary pixel circuit, and a connection line. The substrate includes a main display area, a component area, and a peripheral area. The main display element is connected to the main pixel circuit. The main pixel circuit and the main display element are disposed on the main display area. The auxiliary display element is disposed on the component area. The auxiliary pixel circuit is disposed on the peripheral area. The connection line connects the auxiliary display element to the auxiliary pixel circuit. The auxiliary display element includes an auxiliary pixel electrode. On a plane, an outer portion of the auxiliary pixel electrode has a curved shape.

The foregoing general description and the following detailed description are illustrative and explanatory and are intended to provide further explanation of the claimed subject matter.

BRIEF DESCRIPTION OF THE DRAWINGS

The accompanying drawings, which are included to provide a further understanding of the inventive concepts, and are incorporated in and constitute a part of this specification, illustrate embodiments of the inventive concepts, and, together with the description, serve to explain principles of the inventive concepts. In the drawings.

DETAILED DESCRIPTION OF SOME EMBODIMENTS

Figure 1A:
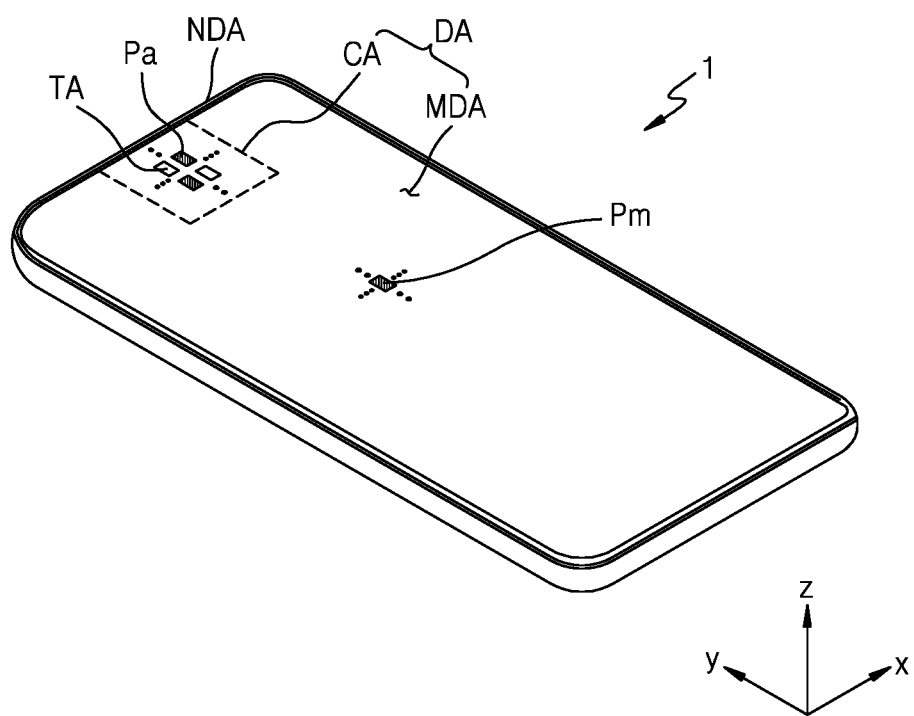
FIGS. 1A, 1B, and 1C are schematic perspective views of a display apparatus according to some embodiments.

In the following description, for the purposes of explanation, numerous specific details are set forth in order to provide a thorough understanding of various embodiments. As used herein, the terms "embodiments" and "implementations" may be used interchangeably and are non-limiting examples employing one or more of the inventive concepts disclosed herein. It is apparent, however, that various embodiments may be practiced without these specific details or with one or more equivalent arrangements. In other instances, well-known structures and devices are shown in block diagram form to avoid unnecessarily obscuring various embodiments. Further, various embodiments may be different, but do not have to be exclusive. For example, specific shapes, configurations, and characteristics of an embodiment may be used or implemented in another embodiment without departing from the inventive concepts.

Unless otherwise specified, the illustrated embodiments are to be understood as providing example features of varying detail of some embodiments. Therefore, unless otherwise specified, the features, components, modules, layers, films, panels, regions, aspects, etc. (hereinafter individually or collectively referred to as an "element" or "elements"), of the various illustrations may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. As such, the sizes and relative sizes of the respective elements are not necessarily limited to the sizes and relative sizes shown in the drawings. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element, it may be directly on, connected to, or coupled to the other element or intervening elements may be present. When, however, an element is referred to as being "directly on," "directly connected to," or "directly coupled to" another element, there are no intervening elements present. Other terms and/or phrases used to describe a relationship between elements should be interpreted in a like fashion, e.g., "between" versus "directly between," "adjacent" versus "directly adjacent," "on" versus "directly on," etc. Further, the term "connected" may refer to physical, electrical, and/or fluid connection. In addition, the x-axis, the y-axis, and the z-axis are not limited to three axes of a rectangular coordinate system, and may be interpreted in a broader sense. For example, the x-axis, the y-axis, and the z-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one element's relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing some embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional views, isometric views, perspective views, plan views, and/or exploded illustrations that are schematic illustrations of idealized embodiments and/or intermediate structures. As such, variations from the shapes of the illustrations as a result of, for example, manufacturing techniques and/or tolerances, are to be expected. Thus, embodiments disclosed herein should not be construed as limited to the particular illustrated shapes of regions, but are to include deviations in shapes that result from, for instance, manufacturing. To this end, regions illustrated in the drawings may be schematic in nature and shapes of these regions may not reflect the actual shapes of regions of a device, and, as such, are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

As customary in the field, some embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some embodiments may be physically separated into two or more interacting and discrete blocks, units, and/or modules without departing from the inventive concepts. Further, the blocks, units, and/or modules of some embodiments may be physically combined into more complex blocks, units, and/or modules without departing from the inventive concepts.

Figure 1B:
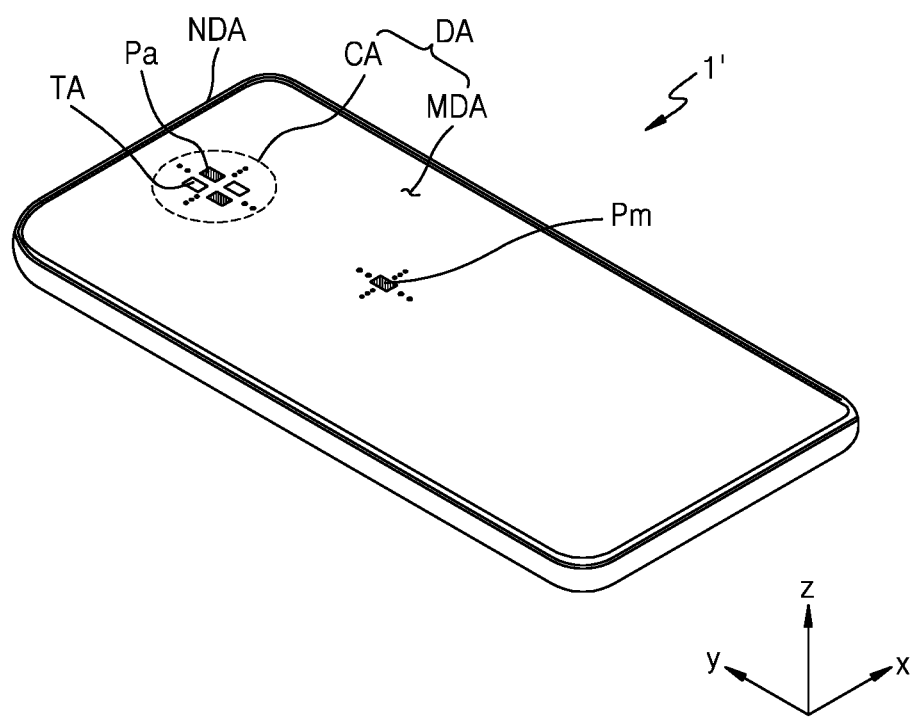
Figure 1C:
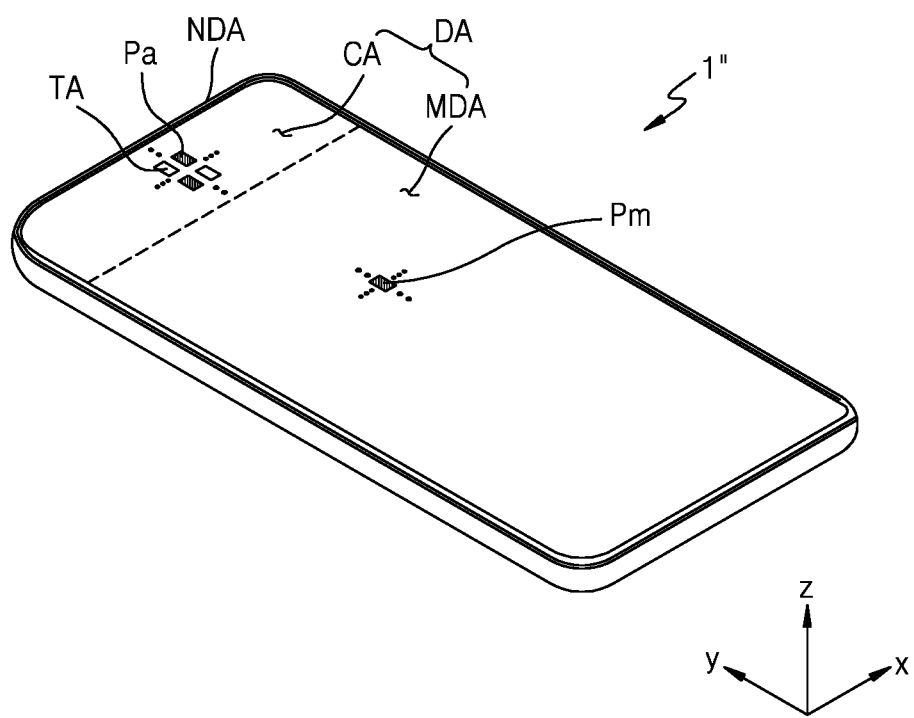

Hereinafter, various embodiments will be explained in detail with reference to the accompanying drawings FIGS. 1A to 1C are schematic perspective views of a display apparatus according to some embodiments.

Referring to FIGS. 1A to 1C, a display apparatus 1, 1', and 1" may include a display area DA and a peripheral area NDA outside the display area DA. The display area DA may include a component area CA and a main display area MDA at least partially surrounding the component area CA. The component area CA may display an auxiliary image, and the main display area MDA may display a main image such that the component area CA and the main display area MDA may display an image individually or together. The peripheral area NDA may be a type of non-display area in which display elements are not arranged. The display area DA may be surrounded (e.g., entirely surrounded) by the peripheral area NDA, but embodiments are not limited thereto.

FIG. 1A illustrates that the main display area MDA is positioned to surround at least a portion of one component area CA. In another embodiment, the display apparatus 1 may include two or more component areas CA, and shapes and sizes of the plurality of component areas CA may be the same as or different from each other. When viewed in a direction substantially perpendicular to the upper surface of the display apparatus 1, the component area CA may have various shapes, such as a circular shape, an elliptical shape, a polygonal shape (e.g., a rectangular shape, a star shape, a diamond shape, etc.), and/or the like. Also, when viewed in the direction substantially perpendicular to the upper surface of the display apparatus 1, FIG. 1A illustrates that the component area CA is arranged at the upper center (or central area) (in a +y direction) of the main display area MDA having a substantially rectangular shape, but the component area CA may be arranged at one side of the main display area MDA having a rectangular shape, for example, at the upper right side or the upper left side thereof. For example, a circular component area CA may be positioned in the main display area MDA as illustrated in FIG. 1B, or a rectangular bar-type component area CA may be positioned at one side of the main display area MDA as illustrated in FIG. 1C.

The display apparatus 1 may provide an image using a plurality of main subpixels Pm arranged in the main display area MDA and a plurality of auxiliary subpixels Pa arranged in the component area CA.

As will be described later with reference to FIG. 2, in the component area CA, a component 40, which is an electronic element, may be arranged under a display panel corresponding to the component area CA.

The component 40 may include an electronic element using light or sound. For example, the electronic element may be a sensor that measures a distance, such as a proximity sensor, a sensor that recognizes a part of a user's body (e.g., a fingerprint, an iris, a face, etc.), a small lamp that outputs light, an image sensor (e.g., a camera) that captures an image, etc. An electronic element using light may use light of various wavelength bands, such as visible light, infrared light, or ultraviolet light. An electronic element using sound may use ultrasound or sound of another frequency band. In some embodiments, the component 40 may include sub-components, such as a light-emitting portion and a light-receiving portion. The light-emitting portion and the light-receiving portion may have an integrated structure or a physically separated structure such that a pair of the light-emitting portion and the light-receiving portion may constitute one component 40. To minimize the limitation of the function of the component 40, the component area CA may include a transmission area TA that may transmit light and/or sound output from the component 40 to the outside or propagating toward the component 40 from the outside.

In the case of the display panel according to an embodiment and the display apparatus including the same, when light is transmitted through the component area CA, light transmittance of the component area CA may be about 10% or more, such as 40% or more, e.g., 25% or more, for instance, 50% or more, such as 85% or more, for example 90% or more.

A plurality of auxiliary subpixels Pa may be arranged in the component area CA. The auxiliary subpixels Pa may provide a certain image by emitting light. The image displayed in the component area CA may be an auxiliary image and may have a resolution lower than that of the image displayed in the main display area MDA. For example, the component area CA may include a transmission area TA through which light and sound may be transmitted, and when no subpixel is arranged over the transmission area TA, the number of auxiliary subpixels Pa that may be arranged per unit area therein may be less than the number of main subpixels Pm arranged per unit area in the main display area MDA.

Hereinbelow, although an organic light-emitting display apparatus is described as an example of the display apparatus 1 according to some embodiments, the display apparatus is not limited thereto. In another embodiment, the display apparatus 1 may be an inorganic light-emitting display, an inorganic electroluminescence (EL) display, or a quantum dot light-emitting display. For example, an emission layer of a display element included in the display apparatus 1 may include an organic material, an inorganic material, quantum dots, an organic material and quantum dots, or an inorganic material and quantum dots.

Figure 2:
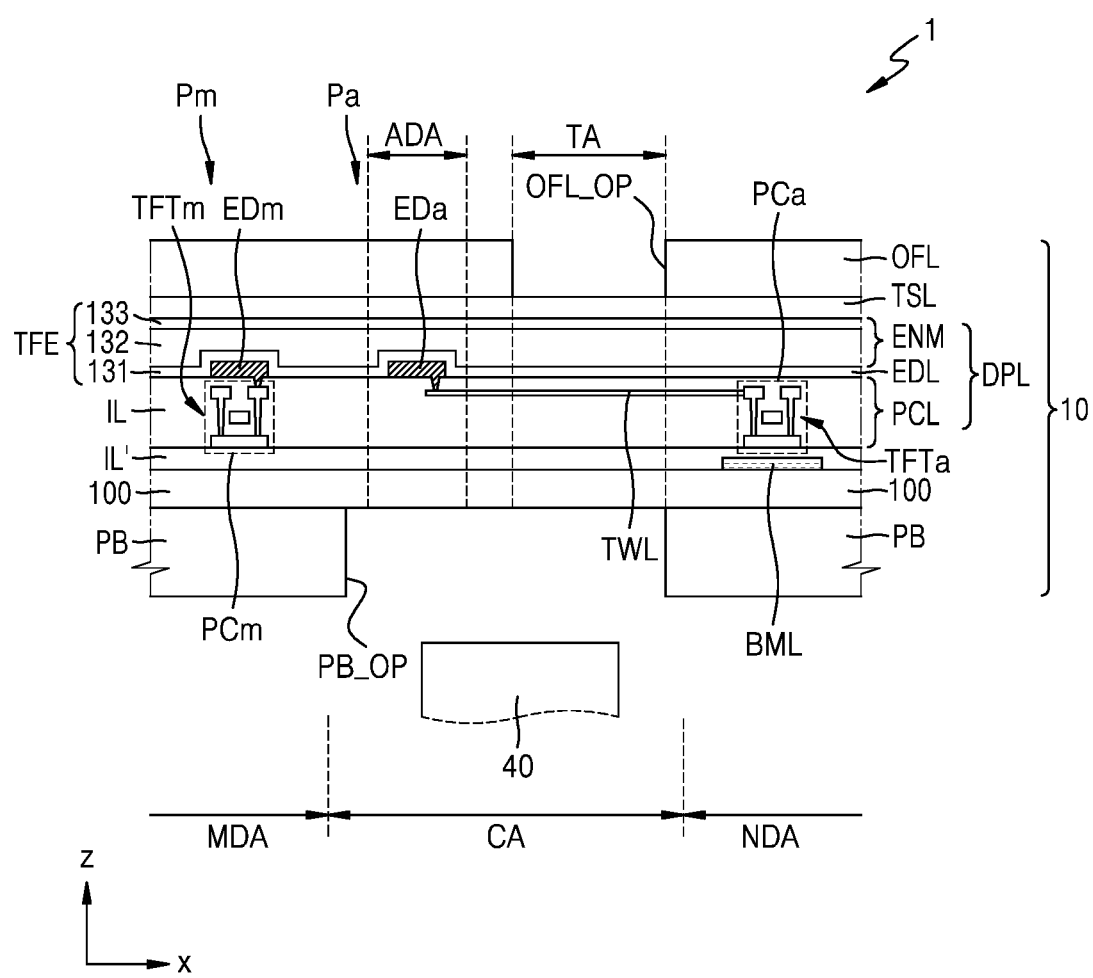
FIG. 2 is a schematic cross-sectional view of a portion of a cross-section of a display apparatus according to an embodiment.

FIG. 2 is a schematic cross-sectional view of a portion of a cross-section of the display apparatus 1 according to an embodiment.

Referring to FIG. 2, the display apparatus 1 may include a display panel 10 and a component 40 overlapping the display panel 10. A cover window may be further arranged over the display panel 10 so as to protect the display panel 10.

The display panel 10 includes a component area CA, which is an area overlapping the component 40, and a main display area MDA in which a main image can be displayed. The display panel 10 may include a substrate 100, a display layer DPL over the substrate 100, a touch screen layer TSL, an optical functional layer OFL, and a panel protection member PB arranged under the substrate 100.

The display layer DPL may include a circuit layer PCL including thin-film transistors TFTm and TFTa, a display element layer EDL including light-emitting elements EDm and EDa as display elements, and a thin-film encapsulation layer TFE and/or an encapsulation member ENM, such as an encapsulation substrate. Insulating layers IL and IL' may be respectively arranged in the display layer DPL and between the substrate 100 and the display layer DPL.

The substrate 100 may include an insulating material, such as at least one of glass, quartz, and a polymer resin. The substrate 100 may include a rigid substrate and/or a flexible substrate that is bendable, foldable, and/or rollable.

A main light-emitting element EDm and a main pixel circuit PCm connected thereto may be arranged in the main display area MDA of the display panel 10. The main pixel circuit PCm may include at least one thin-film transistor TFTm and may control an operation of the main light-emitting element EDm. A main subpixel Pm may be implemented by light emission of the main light-emitting element EDm.

An auxiliary light-emitting element EDa may be arranged in the component area CA of the display panel 10 to implement an auxiliary subpixel Pa. In some embodiments, an auxiliary pixel circuit PCa driving the auxiliary light-emitting element EDa may not be arranged in the component area CA, but may be arranged in the peripheral area NDA that is a non-display area. In another embodiment, the auxiliary pixel circuit PCa may be arranged in a portion of the main display area MDA or may be arranged between the main display area MDA and the component area CA. Various modifications are also contemplated. For example, the auxiliary pixel circuit PCa may be arranged not to overlap the auxiliary light-emitting element EDa.

The auxiliary pixel circuit PCa may include at least one thin-film transistor TFTa and may be electrically connected to the auxiliary light-emitting element EDa by a connection line TWL. The connection line TWL may include a transparent conductive material. The auxiliary pixel circuit PCa may control light emission of the auxiliary light-emitting element EDa. The auxiliary subpixel Pa may be implemented by light emission of the auxiliary light-emitting element EDa.

An area of the component area CA in which the auxiliary light-emitting element EDa is arranged may be defined as an auxiliary display area ADA, and an area of the component area CA in which the auxiliary light-emitting element EDa is not arranged may be defined as a transmission area TA.

The transmission area TA may be an area through which light/signal output from the component 40 or light/signal input to the component 40 arranged to correspond to the component area CA is transmitted. The auxiliary display area ADA and the transmission area TA may be alternately arranged in the component area CA. The connection line TWL connecting the auxiliary pixel circuit PCa to the auxiliary light-emitting element EDa may be arranged in the transmission area TA. At least because the connection line TWL may include a transparent conductive material having high transmittance, the transmittance of the transmission area TA may be secured even when the connection line TWL is arranged in the transmission area TA. In some embodiments, at least because the auxiliary pixel circuit PCa is not arranged in the component area CA, the area of the transmission area TA may be easily enlarged, and light transmittance of the transmission area TA may be further improved.

The display element layer EDL may be covered by the thin-film encapsulation layer TFE and/or the encapsulation member ENM as illustrated in FIG. 2. In an embodiment, as illustrated in FIG. 2, the thin-film encapsulation layer TFE may include at least one inorganic encapsulation layer and at least one organic encapsulation layer. For example, the thin-film encapsulation layer TFE may include first and second inorganic encapsulation layers 131 and 133 and an organic encapsulation layer 132 therebetween.

The first inorganic encapsulation layer 131 and the second inorganic encapsulation layer 133 may include one or more inorganic insulating materials, such as at least one of silicon oxide ($SiO_2$), silicon nitride ($SiN_x$), silicon oxynitride ($SiO_xN_y$), aluminum oxide ($Al_2O_3$), titanium oxide ($TiO_2$), tantalum oxide ($Ta_2O_5$), hafnium oxide ($HfO_2$), and zinc oxide ($ZnO_2$), and may be formed by chemical vapor deposition (CVD) and/or the like. The organic encapsulation layer 132 may include a polymer-based material. The polymer-based material may include at least one of a siliconbased resin, an acrylic resin (e.g., polymethylmethacrylate, polyacrylic acid, etc.), an epoxy-based resin, polyimide, polyethylene, and the like.

The first inorganic encapsulation layer 131, the organic encapsulation layer 132, and the second inorganic encapsulation layer 133 may be formed as one body to cover the main display area MDA and the component area CA.

When the display element layer EDL is encapsulated by the encapsulation substrate, the encapsulation substrate may be arranged to face the substrate 100 with the display element layer EDL therebetween. A gap may be between the encapsulation substrate and the display element layer EDL. The encapsulation substrate may include glass. A sealant including frit or the like may be between the substrate 100 and the encapsulation substrate, and the sealant may be arranged in the peripheral area NDA. The sealant arranged in the peripheral area NDA may surround the display area DA and prevent moisture from penetrating through side surfaces of the display area DA.

The touch screen layer TSL may obtain coordinate information according to an external input, for example, a touch event. The touch screen layer TSL may include a touch electrode and touch wires connected to the touch electrode. The touch screen layer TSL may sense an external input using a self-capacitance method and/or a mutual capacitance method.

The touch screen layer TSL may be formed over the thin-film encapsulation layer TFE. Alternatively, the touch screen layer TSL may be separately formed over a touch substrate and then coupled onto the thin-film encapsulation layer TFE through an adhesive layer, such as an optical clear adhesive (OCA). In an embodiment, the touch screen layer TSL may be directly formed over the thin-film encapsulation layer TFE, and in this case, an adhesive layer may not be between the touch screen layer TSL and the thin-film encapsulation layer TFE.

The optical functional layer OFL may include an anti-reflective layer. The anti-reflective layer may reduce reflectance of light (e.g., external light) incident from the outside toward the display apparatus 1.

In an embodiment, the optical functional layer OFL may include a polarization film. The optical functional layer OFL may include an opening OFL_OP corresponding to the transmission area TA. Thus, the light transmittance of the transmission area TA may be significantly improved. The opening OFL_OP may be filled with a transparent material, such as optically clear resin (OCR). In another embodiment, the optical functional layer OFL may be provided as a filter plate including a black matrix and color filters.

The panel protection member PB may be attached under the substrate 100 to support and protect the substrate 100. The panel protection member PB may include an opening PB_OP corresponding to the component area CA. At least because the panel protection member PB includes the opening PB_OP, the light transmittance of the component area CA may be improved. The panel protection member PB may include at least one of polyethylene terephthalate and polyimide.

The area of the component area CA may be greater than the area in which the component 40 is arranged. Accordingly, the area of the opening PB_OP included in the panel protection member PB may not match the area of the component area CA. FIG. 2 illustrates that the component 40 is arranged to be spaced apart from one side of the display panel 10, but at least a portion of the component 40 may be inserted into the opening PB_OP included in the panel protection member PB.

Also, a plurality of components 40 may be arranged in the component area CA. The components 40 may have different functions. For example, the components 40 may include at least two of a camera (imaging device), a solar cell, a flash, a proximity sensor, an illumination sensor, and an iris sensor.

Moreover, as illustrated in FIG. 2, a bottom metal layer BML may be arranged under the auxiliary light-emitting element EDa of the component area CA. The bottom metal layer BML may be arranged to overlap pixel circuits to protect the pixel circuits. In an embodiment, the bottom metal layer BML may be arranged to overlap the auxiliary pixel circuit PCa between the substrate 100 and the auxiliary pixel circuit PCa corresponding to the peripheral area NDA. The bottom metal layer BML may block external light from reaching the auxiliary pixel circuit PCa. In another embodiment, the bottom metal layer BML may be formed to correspond to the entire display area DA and may include a bottom-hole corresponding to the component area CA. In another embodiment, the bottom metal layer BML may be omitted in the display apparatus 1.

Figure 3:
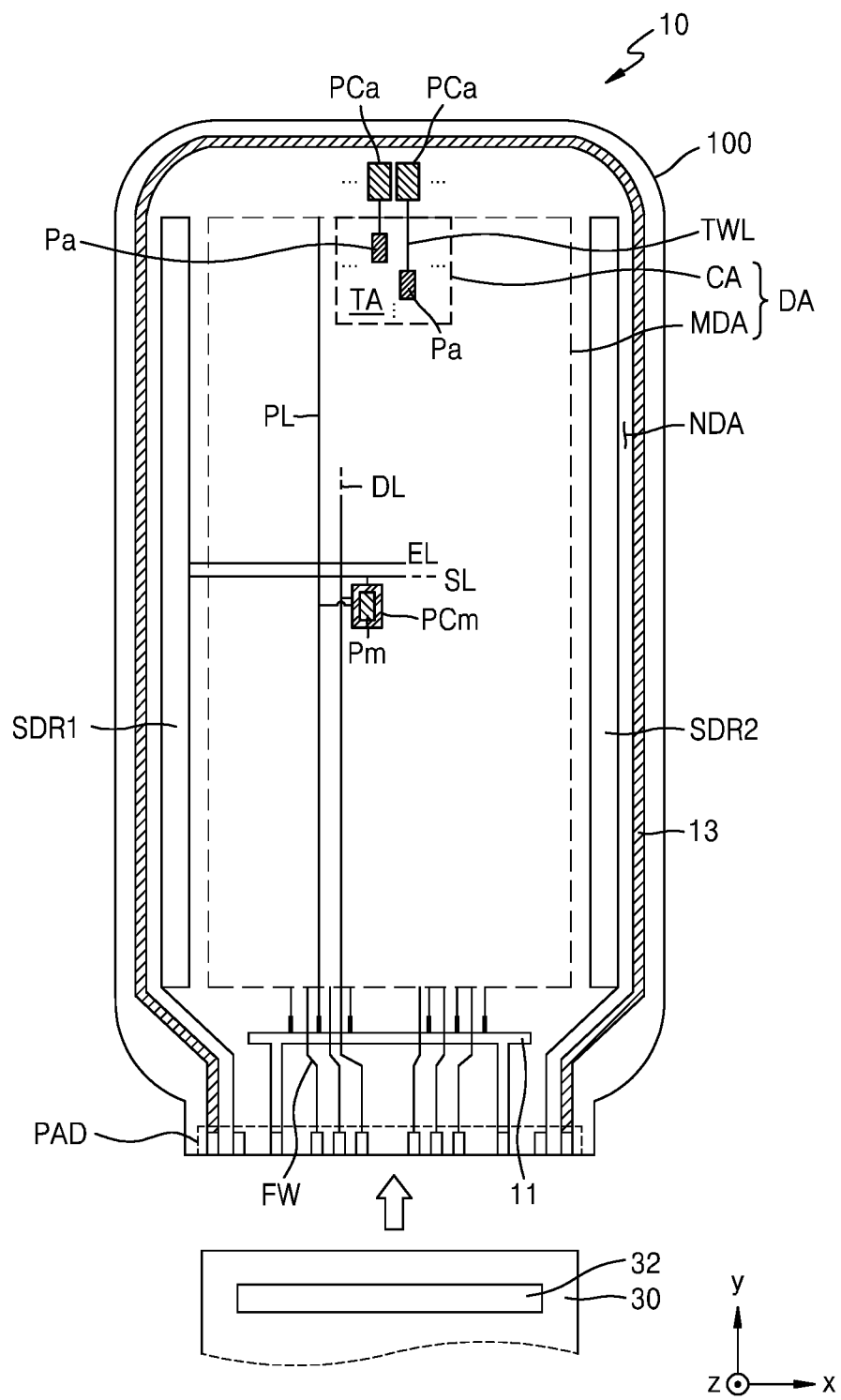
FIG. 3 is a schematic plan view of a display panel that may be included in the display apparatuses of FIGS. 1A to 1C according to some embodiments.

FIG. 3 is a schematic plan view of the display panel 10 that may be included in the display apparatus of FIG. 1 according to an embodiment.

Referring to FIG. 3, various elements constituting the display panel 10 may be arranged over a substrate 100.

A plurality of main subpixels Pm may be arranged in the main display area MDA. Each of the main subpixels Pm may be implemented as a light-emitting element by a display element, such as an organic light-emitting diode (OLED). A main pixel circuit PCm driving the main subpixel Pm may be arranged in the main display area MDA, and the main pixel circuit PCm may be arranged to overlap the main subpixel Pm. Each main subpixel Pm may emit, for example, red, green, blue, or white light. The main display area MDA may be covered with an encapsulation member to be protected from external air or moisture.

The component area CA may be positioned at one side of the main display area MDA as described above or may be arranged inside the display area DA and surrounded by the main display area MDA. A plurality of auxiliary subpixels Pa may be arranged in the component area CA. Each of the auxiliary subpixels Pa may be implemented as a light-emitting element by a display element, such as an OLED. Each auxiliary subpixel Pa may emit, for example, red, green, blue, or white light. The component area CA may be covered with an encapsulation member to be protected from external air or moisture.

Moreover, the auxiliary pixel circuit PCa driving the auxiliary subpixel Pa may be arranged in the peripheral area NDA adjacent to the component area CA. For example, as illustrated in FIG. 3, when the component area CA is arranged over the display area DA, the auxiliary pixel circuit PCa may be arranged at the upper side of peripheral area NDA. The auxiliary pixel circuit PCa and the display element implementing the auxiliary subpixel Pa may be connected by a connection line TWL extending in one direction (e.g., a y-direction).

In an embodiment, FIG. 3 illustrates that the auxiliary pixel circuit PCa is positioned directly over the component area CA, but embodiments are not limited thereto.

Moreover, the component area CA may include a transmission area TA. The transmission area TA may be arranged to surround the auxiliary subpixels Pa. Alternatively, the transmission area TA may be arranged in a lattice form with the auxiliary subpixels Pa.

At least because the component area CA includes the transmission area TA, a resolution of the component area CA may be lower than a resolution of the main display area MDA. For example, the resolution of the component area CA may be about ½, ⅜, ⅓, ¼, 2/9, ⅛, 1/9, or 1/16 of the resolution of the main display area MDA. For example, the resolution of the main display area MDA may be about 400 ppi or more, and the resolution of the component area CA may be about 200 ppi or about 100 ppi.

Each of the main and auxiliary pixel circuits PCm and PCa driving the main and auxiliary subpixels Pm and Pa may be electrically connected to outer circuits arranged in the peripheral area NDA. A first scan driving circuit SDR1, a second scan driving circuit SDR2, a terminal portion PAD, a driving voltage supply line 11, and a common voltage supply line 13 may be arranged in the peripheral area NDA.

The first scan driving circuit SDR1 may apply a scan signal to the main pixel circuit PCm driving the main subpixel Pm through a scan line SL. Also, the first scan driving circuit SDR1 may apply an emission control signal to each pixel circuit through an emission control line EL. The second scan driving circuit SDR2 may be arranged symmetrically to the first scan driving circuit SDR1 with respect to the main display area MDA. A portion of the main pixel circuit PCm of the main subpixel Pm of the main display area MDA may be electrically connected to the first scan driving circuit SDR1, and the other portion thereof may be electrically connected to the second scan driving circuit SDR2.

The terminal portion PAD may be arranged at one side of the substrate 100. The terminal portion PAD may not be covered by an insulating layer and may be exposed to be connected to a display circuit board 30. A display driver 32 may be arranged in (or on) the display circuit board 30.

The display driver 32 may generate a control signal to be transmitted to the first scan driving circuit SDR1 and the second scan driving circuit SDR2. The display driver 32 may generate a data signal, and the generated data signal may be transmitted to the main pixel circuit PCm through a fan-out line FW and a main data line DL connected to the fan-out line FW.

The display driver 32 may supply a driving voltage ELVDD to the driving voltage supply line 11 and may supply a common voltage ELVSS to the common voltage supply line 13. The driving voltage ELVDD may be applied to the pixel circuits of the main and auxiliary subpixels Pm and Pa through a driving voltage line PL connected to the driving voltage supply line 11, and the common voltage ELVSS may be connected to the common voltage supply line 13 to be applied to an opposite electrode of the display element.

The driving voltage supply line 11 may be provided to extend in an x-direction under the main display area MDA. The common voltage supply line 13 may have a shape in which one side thereof is open in a loop shape to partially surround the main display area MDA.

FIG. 3 illustrates a case where there is one component area CA, but a plurality of component areas CA may be provided. In this case, the component areas CA may be arranged to be spaced apart from each other, a first camera may be arranged to correspond to a component area CA, and a second camera may be arranged to correspond to another component area CA. As another example, a camera may be arranged to correspond to a component area CA, and an infrared sensor may be arranged to correspond to another component area CA. Shapes and sizes of the component areas CA may be different from each other.

Figure 4A:
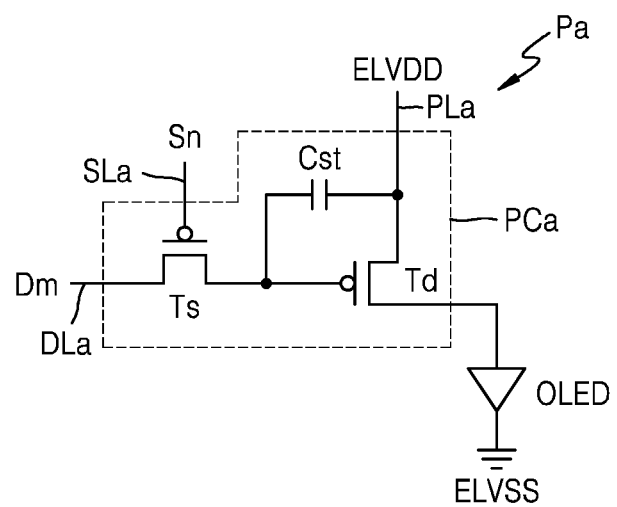
FIGS. 4A and 4B are equivalent circuit diagrams of a pixel that may be included in a display apparatus according to some embodiments.
Figure 4B:
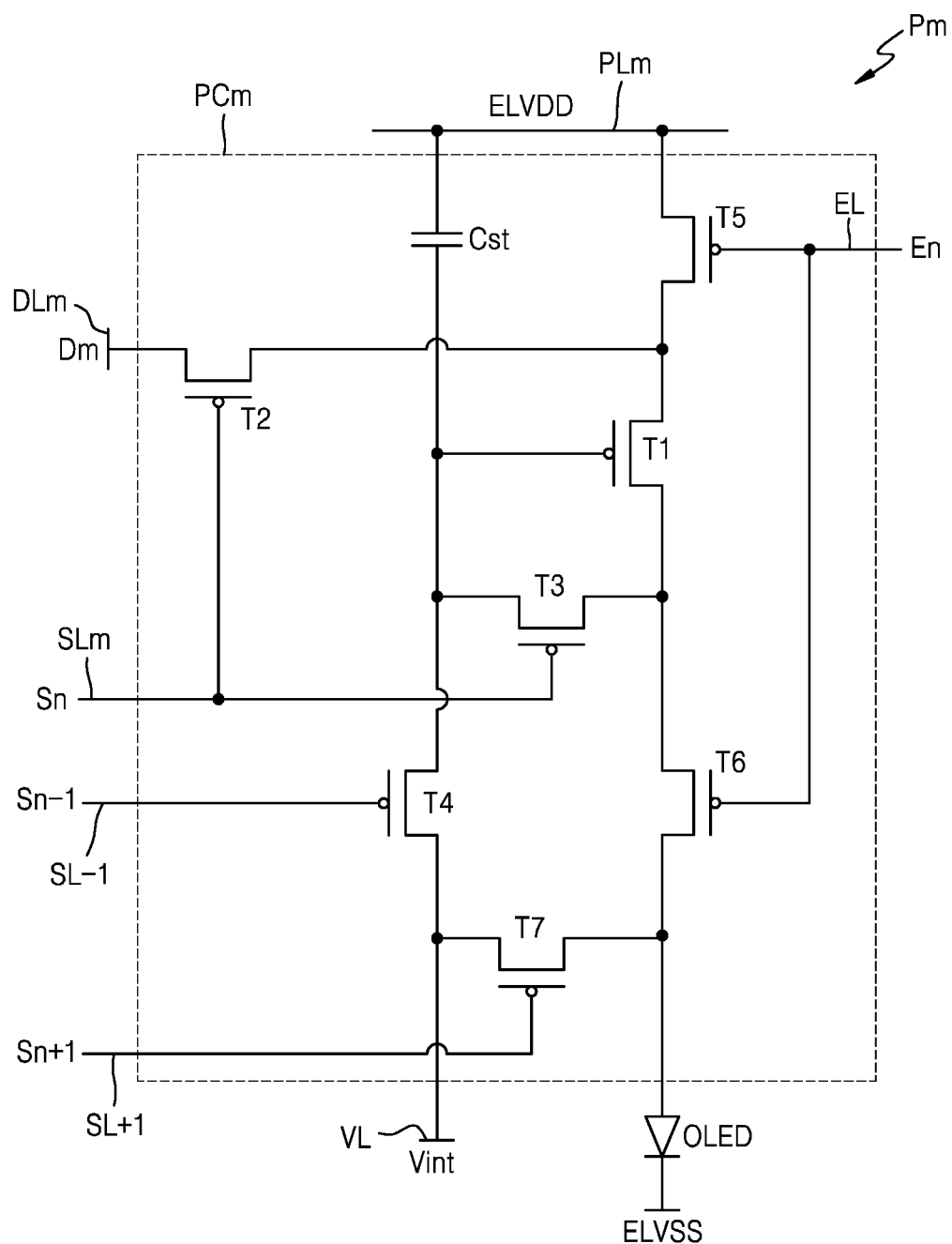

FIGS. 4A and 4B are equivalent circuit diagrams of a pixel that may be included in a display apparatus according to some embodiments.

Referring to FIGS. 4A and 4B, a main subpixel Pm includes a main pixel circuit PCm and an organic light-emitting diode OLED as a display element connected to the main pixel circuit PCm, and an auxiliary subpixel Pa includes an auxiliary pixel circuit PCa and an organic light-emitting diode OLED as a display element connected to the auxiliary pixel circuit PCa. FIGS. 4A and 4B illustrate that the auxiliary subpixel Pa includes the pixel circuit of FIG. 4A and the main subpixel Pm includes the pixel circuit of FIG. 4B, but embodiments are not limited thereto. In another embodiment, the main and auxiliary subpixels Pm and Pa may include at least one of the main and auxiliary pixel circuits PCm and PCa of FIG. 4A or 4B. For example, both the main subpixel Pm and the auxiliary subpixel Pa may include the pixel circuit of FIG. 4B.

The auxiliary pixel circuit PCa of FIG. 4A includes a driving thin-film transistor Td, a switching thin-film transistor Ts, and a storage capacitor Cst. The switching thin-film transistor Ts is connected to an auxiliary scan line SLa and an auxiliary data line DLa and is configured to transmit a data signal Dm, input through the auxiliary data line DLa, to the driving thin-film transistor Td in response to a scan signal Sn input through the auxiliary scan line SLa.

The storage capacitor Cst is connected to the switching thin-film transistor Ts and an auxiliary driving voltage line PLa and is configured to store a voltage corresponding to a difference between a voltage received from the switching thin-film transistor Ts and a driving voltage ELVDD supplied to the auxiliary driving voltage line PLa.

The driving thin-film transistor Td is connected to the auxiliary driving voltage line PLa and the storage capacitor Cst and may be configured to control a driving current flowing through the organic light-emitting diode OLED from the auxiliary driving voltage line PLa in response to the voltage stored in the storage capacitor Cst. The organic light-emitting diode OLED may emit light having a certain luminance according to a driving current $I_d$.

FIG. 4A illustrates a case where the auxiliary pixel circuit PCa includes two thin-film transistors and one storage capacitor, but embodiments are not limited thereto. In another embodiment, the auxiliary pixel circuit PCa may include seven thin-film transistors and one storage capacitor such as illustrated in FIG. 4B, which will be described below. In another embodiment, the auxiliary pixel circuit PCa may include two or more storage capacitors.

Referring to FIG. 4B, the main pixel circuit PCm may include a driving thin-film transistor T1, a switching thin-film transistor T2, a compensation thin-film transistor T3, a first initialization thin-film transistor T4, an operation control thin-film transistor T5, an emission control thin-film transistor T6, and a second initialization thin-film transistor T7.

FIG. 4B illustrate a case where each main pixel circuit PCm includes (main) signal lines SL, SL−1, SL+1, EL, and DL, a (main) initialization voltage line VL, and a (main) driving voltage line PL, but embodiments are not limited thereto. In another embodiment, at least one of the (main) signal lines SL, SL−1, SL+1, EL, and DL, and/or the (main) initialization voltage line VL may be shared by adjacent pixel circuits.

A drain electrode of the driving thin-film transistor T1 may be electrically connected to the organic light-emitting diode OLED via the emission control thin-film transistor T6. The driving thin-film transistor T1 is configured to receive a data signal Dm depending on a switching operation of the switching thin-film transistor T2 and supply a driving current to the organic light-emitting diode OLED.

A gate electrode of the switching thin-film transistor T2 is connected to a main scan line SLm, and a source electrode of the switching thin-film transistor T2 is connected to a main data line DLm. A drain electrode of the switching thin-film transistor T2 may be connected to a source electrode of the driving thin-film transistor T1 and may also be connected to a main driving voltage line PLm via the operation control thin-film transistor T5.

The switching thin-film transistor T2 is turned on in response to a scan signal Sn received through the main scan line SLm and is configured to perform a switching operation of transmitting the data signal Dm received through the main data line DLm to the source electrode of the driving thin-film transistor T1.

A gate electrode of the compensation thin-film transistor T3 may be connected to the main scan line SLm. A source electrode of the compensation thin-film transistor T3 may be connected to the drain electrode of the driving thin-film transistor T1 and may also be connected to a pixel electrode (e.g., an anode) of the organic light-emitting diode OLED via the emission control thin-film transistor T6. A drain electrode of the compensation thin-film transistor T3 may be connected to any one of electrodes of the storage capacitor Cst, a source electrode of the first initialization thin-film transistor T4, and a gate electrode of the driving thin-film transistor T1. The compensation thin-film transistor T3 is turned on in response to the scan signal Sn received through the main scan line SLm and is configured to connect the gate electrode and the drain electrode of the driving thin-film transistor T1 to each other so that the driving thin-film transistor T1 is diode-connected.

A gate electrode of the first initialization thin-film transistor T4 may be connected to a previous scan line SL−1. A drain electrode of the first initialization thin-film transistor T4 may be connected to the initialization voltage line VL. The source electrode of the first initialization thin-film transistor T4 may be connected to any one of the electrodes of the storage capacitor Cst, the drain electrode of the compensation thin-film transistor T3, and the gate electrode of the driving thin-film transistor T1. The first initialization thin-film transistor T4 may be turned on in response to a previous scan signal Sn−1 received through the previous scan line SL−1 and may be configured to perform an initialization operation of initializing a voltage of the gate electrode of the driving thin-film transistor T1 by transmitting an initialization voltage Vint to the gate electrode of the driving thin-film transistor T1.

A gate electrode of the operation control thin-film transistor T5 may be connected to the emission control line EL. A source electrode of the operation control thin-film transistor T5 may be connected to the main driving voltage line PLm. A drain electrode of the operation control thin-film transistor T5 is connected to the source electrode of the driving thin-film transistor T1 and the drain electrode of the switching thin-film transistor T2.

A gate electrode of the emission control thin-film transistor T6 may be connected to the emission control line EL. A source electrode of the emission control thin-film transistor T6 may be connected to the drain electrode of the driving thin-film transistor T1 and the source electrode of the compensation thin-film transistor T3. A drain electrode of the emission control thin-film transistor T6 may be electrically connected to a pixel electrode of the organic light-emitting diode OLED. The operation control thin-film transistor T5 and the emission control thin-film transistor T6 are simultaneously (or substantially simultaneously) turned on in response to an emission control signal En received through the emission control line EL, the driving voltage ELVDD is transmitted to the organic light-emitting diode OLED, and the driving current flows through the organic light-emitting diode OLED.

A gate electrode of the second initialization thin-film transistor T7 may be connected to a next scan line SL+1. A source electrode of the second initialization thin-film transistor T7 may be connected to the pixel electrode of the organic light-emitting diode OLED. A drain electrode of the second initialization thin-film transistor T7 may be connected to the initialization voltage line VL. The second initialization thin-film transistor T7 may be turned on in response to a next scan signal Sn+1 received through the next scan line SL+1 and may be configured to initialize the pixel electrode of the organic light-emitting diode OLED.

FIG. 4B illustrates a case where the first initialization thin-film transistor T4 and the second initialization thin-film transistor T7 are respectively connected to the previous scan line SL−1 and the next scan line SL+1, but embodiments are not limited thereto. In another embodiment, the first initialization thin-film transistor T4 and the second initialization thin-film transistor T7 may be all connected to the previous scan line SL−1 and may be driven according to the previous scan signal Sn−1.

The other of the electrodes of the storage capacitor Cst may be connected to the main driving voltage line PLm. Any one of the electrodes of the storage capacitor Cst may be connected to the gate electrode of the driving thin-film transistor T1, the drain electrode of the compensation thin-film transistor T3, and the source electrode of the first initialization thin-film transistor T4.

An opposite electrode (e.g., a cathode) of the organic light-emitting diode OLED is configured to receive a common voltage ELVSS. The organic light-emitting diode OLED may be configured to receive the driving current from the driving thin-film transistor T1 and emit light.

The main and auxiliary pixel circuits PCm and PCa according to some embodiments are not limited to the number and circuit design of the thin-film transistors and the storage capacitor described with reference to FIGS. 4A and 4B, and the number of components and circuit design thereof may be variously changed.

Figure 5A:
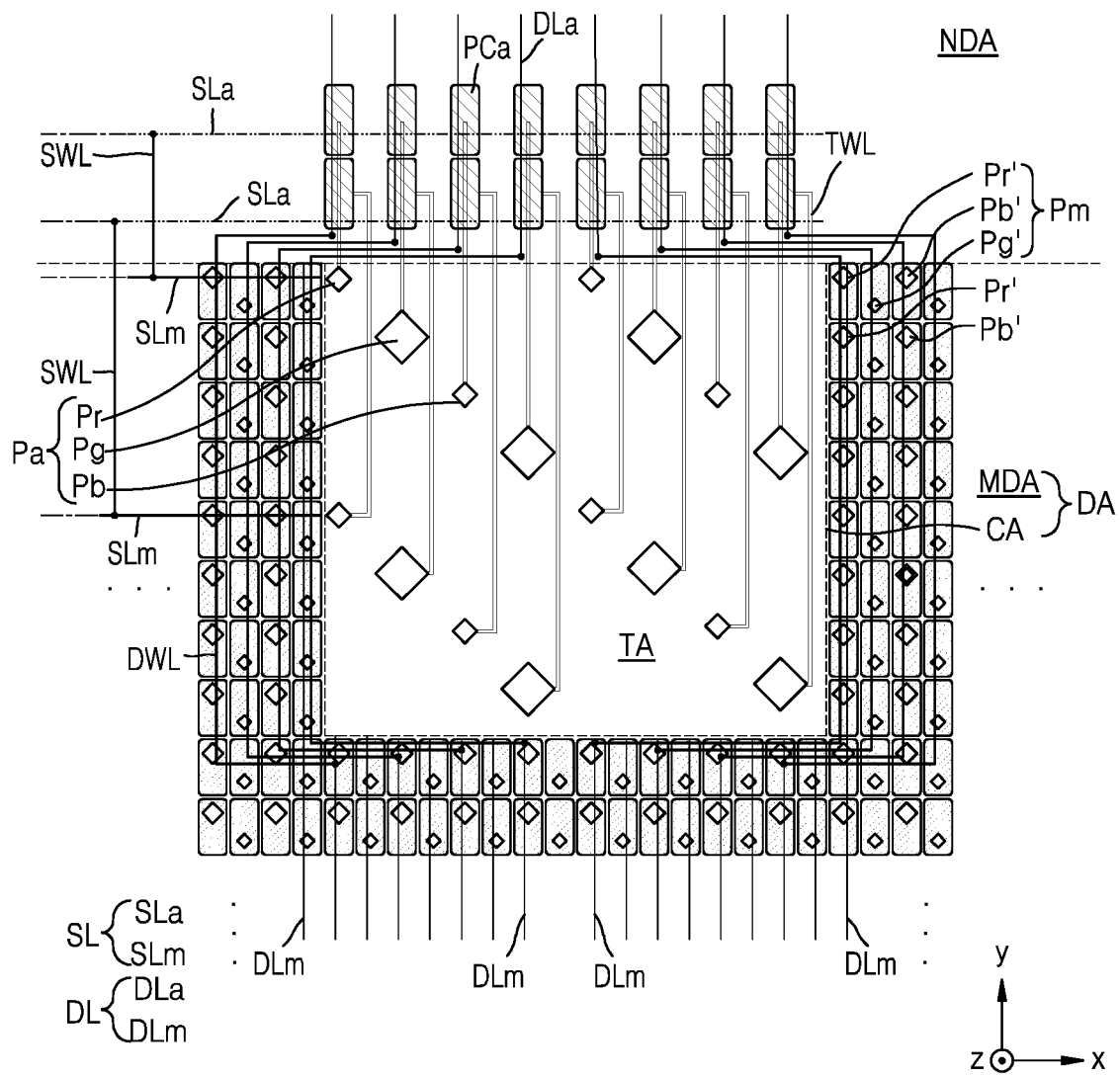
FIGS. 5A and 5B are schematic plan layout diagrams of an area of a display apparatus according to some embodiments.
Figure 5B:
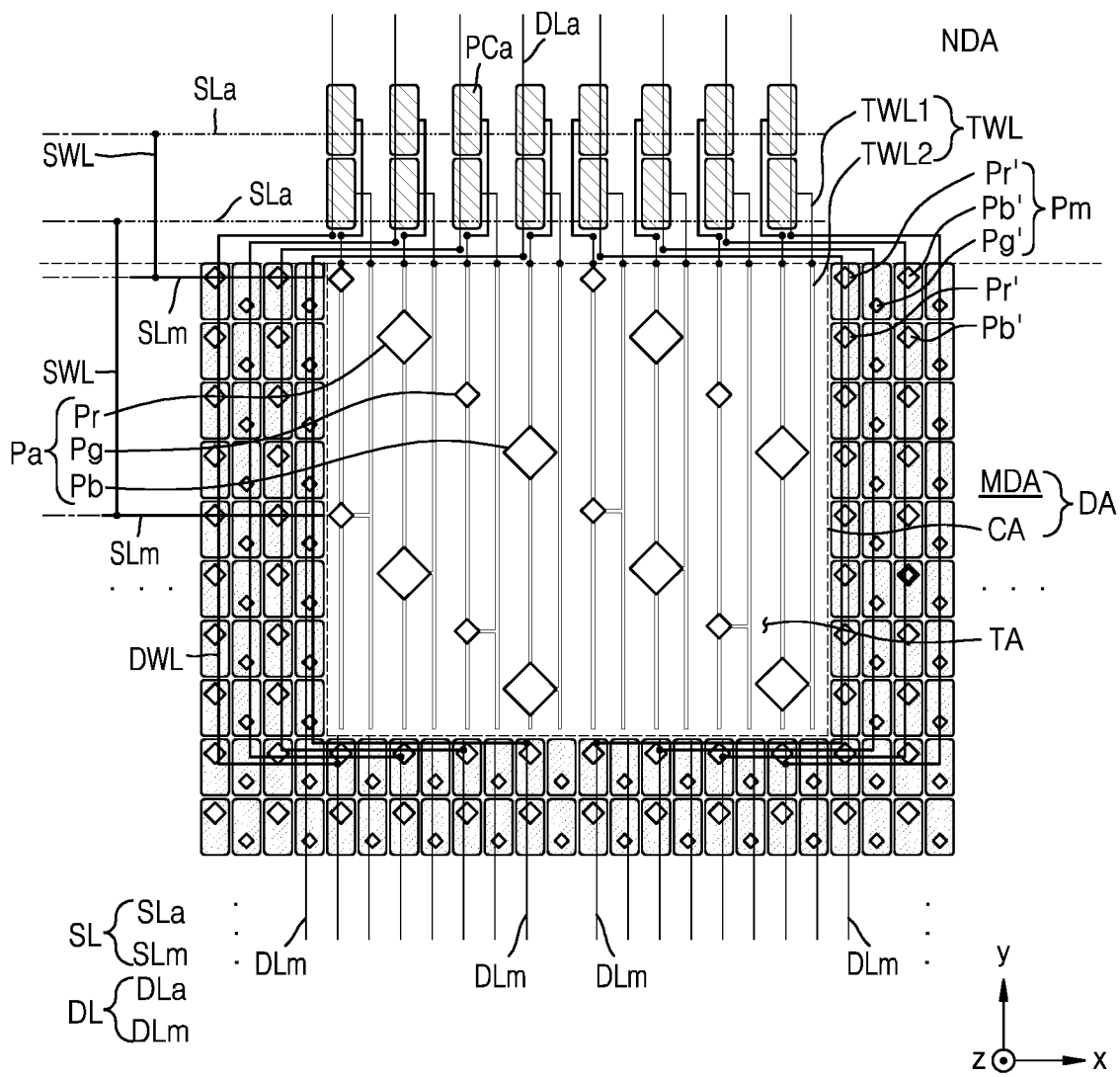

FIGS. 5A and 5B are schematic plan layout diagrams of an area of a display apparatus according to some embodiments.

In FIGS. 5A and 5B, the component area CA, the main display area MDA adjacent thereto, and a portion of the peripheral area NDA are illustrated.

Referring to FIG. 5A, a plurality of main subpixels Pm may be arranged in the main display area MDA. Herein, a subpixel may refer to an emission area that emits light by a display element as a minimum unit implementing an image. Moreover, when an organic light-emitting diode is used as a display element, the emission area may be defined by an opening of a pixel-defining layer. This will be described in more detail below. Each of the main subpixels Pm may emit any one of red, green, blue, and white light.

In an embodiment, the main subpixels Pm arranged in the main display area MDA may include a first subpixel Pr', a second subpixel Pg', and a third subpixel Pb'. The first subpixel Pr', the second subpixel Pg', and the third subpixel Pb' may respectively implement red, green, and blue colors. The main subpixels Pm may be arranged in a PenTile structure, but embodiments are not limited thereto.

For example, first subpixels Pr' may be arranged at first and third vertexes facing each other among vertexes of a virtual square having a central point of the second subpixel Pg' as a central point thereof, and third subpixels Pb' may be arranged at second and fourth vertexes that are the other vertexes thereof. In an embodiment, a size (e.g., an emission area) of the second subpixel Pg' may be smaller than sizes (e.g., emission areas) of the first subpixel Pr' and the third subpixel Pb'.

Such a pixel arrangement structure may be referred to as a PenTile matrix structure or a PenTile structure, and high resolution may be implemented by a fewer number of pixels by applying a rendering drive that represents colors by sharing adjacent pixels.

FIG. 5A illustrates that a plurality of main subpixels Pm are arranged in a PenTile matrix structure, but embodiments are not limited thereto. For example, the main subpixels Pm may be arranged in various forms, such as a stripe structure, a mosaic arrangement structure, a delta arrangement structure, etc.

In the main display area MDA, main pixel circuits PCm may be arranged to overlap the main subpixels Pm, and the main pixel circuits PCm may be arranged in a matrix form in the x- and y-directions. Herein, a main pixel circuit PCm may refer to a unit of a pixel circuit implementing one main subpixel Pm.

A plurality of auxiliary subpixels Pa may be arranged in the component area CA. Each of the main subpixels Pm may emit any one of red, green, blue, and white light. The auxiliary subpixels Pa may include a first subpixel Pr, a second subpixel Pg, and a third subpixel Pb that emit different colors. The first subpixel Pr, the second subpixel Pg, and the third subpixel Pb may respectively implement red, green, and blue colors.

A number per unit area of the auxiliary subpixels Pa arranged in the component area CA may be less than a number per unit area of the main subpixels Pm arranged in the main display area MDA. For example, the number of auxiliary subpixels Pa and the number of main subpixels Pm arranged per the same area may be in a ratio of 1:2, 1:4, 1:8, or 1:9. For instance, the resolution of the component area CA may be ½, ¼, ⅛, or ⅑ of the resolution of the main display area MDA. FIG. 5A illustrates a case where the resolution of the component area CA is ⅛ of the resolution of the main display area MDA.

The auxiliary subpixels Pa arranged in the component area CA may be arranged in various forms. Some auxiliary subpixels Pa among the auxiliary subpixels Pa may be collected to form a pixel group and may be arranged in various forms such as a PenTile structure, a stripe structure, a mosaic arrangement structure, a delta arrangement structure in the pixel group, or the like. In this case, a distance between the auxiliary subpixels Pa arranged in the pixel group may be equal to a distance between the main subpixels Pm.

Alternatively, as illustrated in FIG. 5A, the auxiliary subpixels Pa may be distributed and arranged in the component area CA. For instance, the distance between the auxiliary subpixels Pa may be greater than the distance between the main subpixels Pm. Moreover, an area in which the auxiliary subpixels Pa are not arranged in the component area CA may be referred to as a transmission area TA having high light transmittance.

Auxiliary pixel circuits PCa implementing light emission of the auxiliary subpixels Pa may be arranged in the peripheral area NDA. Because the auxiliary pixel circuits PCa are not arranged in the component area CA, the component area CA may secure a wider (or greater) transmission area TA.

The auxiliary pixel circuits PCa may be connected to the auxiliary subpixels Pa by connection lines TWL. Accordingly, when a length of the connection line TWL increases, a resistance capacitance (RC) delay phenomenon may occur, and thus, the auxiliary pixel circuits PCa may be arranged in consideration of the length of the connection lines TWL.

In an embodiment, the auxiliary pixel circuits PCa may be arranged on an extension line connecting the auxiliary subpixels Pa arranged in the y-direction. Also, the auxiliary pixel circuits PCa may be arranged in the y-direction by the number of auxiliary subpixels Pa arranged in the y-direction. For example, as illustrated in FIG. 5A, when two auxiliary subpixels Pa are arranged in the component area CA in the y-direction, two auxiliary pixel circuits PCa may be arranged in the peripheral area NDA in the y-direction.

The connection lines TWL may extend in the y-direction and may connect the auxiliary subpixels Pa and the auxiliary pixel circuits PCa to each other. When the connection lines TWL are connected to the auxiliary subpixels Pa, the connection lines TWL may be electrically connected to a pixel electrode of a display element implementing the auxiliary subpixels Pa.

A scan line SL may include a main scan line SLm connected to the main pixel circuits PCm and an auxiliary scan line SLa connected to the auxiliary pixel circuits PCa. The main scan line SLm may extend in the x-direction and may be connected to the main pixel circuits PCm arranged in the same row. The main scan line SLm may not be arranged in the component area CA. For instance, the main scan line SLm may be disconnected with the component area CA therebetween. In this case, the main scan line SLm arranged at the left side of the component area CA may receive a signal from the first scan driving circuit SDR1 (see FIG. 3), and the main scan line SLm arranged at the right side of the component area CA may receive a signal from the second scan driving circuit SDR2 (see FIG. 3).

The auxiliary scan line SLa may extend in the x-direction and may be connected to the auxiliary pixel circuits PCa arranged in the same row. The auxiliary scan line SLa may be arranged on the peripheral area NDA.

The main scan line SLm and the auxiliary scan line SLa may be connected by a scan connection line SWL, and thus, the same signal may be applied to the pixel circuits driving the main subpixel Pm and the auxiliary subpixel Pa arranged in the same row. The scan connection line SWL may be arranged on a different layer from the main scan line SLm and the auxiliary scan line SLa, and the scan connection line SWL may be connected to the main scan line SLm and the auxiliary scan line SLa through contact holes, respectively. The scan connection line SWL may be arranged in the peripheral area NDA.

A data line DL may include a main data line DLm connected to the main pixel circuits PCm and an auxiliary data line DLa connected to the auxiliary pixel circuits PCa. The main data line DLm may extend in the y-direction and may be connected to the main pixel circuits PCm arranged in the same column. The auxiliary data line DLa may extend in the y-direction and may be connected to the auxiliary pixel circuits PCa arranged in the same column.

The main data line DLm and the auxiliary data line DLa may be arranged to be spaced apart from each other with the component area CA therebetween. The main data line DLm and the auxiliary data line DLa may be connected by a data connection line DWL, and thus, the same signal may be applied to the pixel circuits driving the main subpixel Pm and the auxiliary subpixel Pa arranged in the same row.

The data connection line DWL may be arranged to bypass the component area CA. In an embodiment, the data connection line DWL may be arranged to overlap the main pixel circuits PCm arranged in the main display area MDA. As the data connection line DWL is arranged in the main display area MDA, it is not necessary to secure a separate space in which the data connection line DWL, and thus, a dead-space area may be minimized or at least reduced.

In another embodiment, the data connection line DWL may be arranged in an intermediate area between the main display area MDA and the component area CA.

The data connection line DWL may be arranged on a different layer from the main data line DLm and the auxiliary data line DLa, and the data connection line DWL may be connected to the main data line DLm and the auxiliary data line DLa through contact holes, respectively.

FIG. 5A illustrates that the connection line TWL is formed as one body from the peripheral area NDA to the auxiliary subpixels Pa of the component area CA, but embodiments are not limited thereto.

As illustrated in FIG. 5B, the connection line TWL may include a first connection line TWL1 and a second connection line TWL2 which include different materials. This will be described below in more detail with reference to FIG. 6.

Moreover, as illustrated in FIG. 5B, a plurality of second connection lines TWL2 may have the same length. For example, ends of the second connection lines TWL2 may extend to a boundary of the component area CA at the opposite side to which the auxiliary pixel circuits PCa are arranged. This may be to match an electrical load by the second connection lines TWL2. Accordingly, a luminance deviation in the component area CA may be minimized or at least reduced. In the component area CA, the number of second connection lines TWL2 may be the same as the number of auxiliary pixel circuits PCa.

Figure 6:
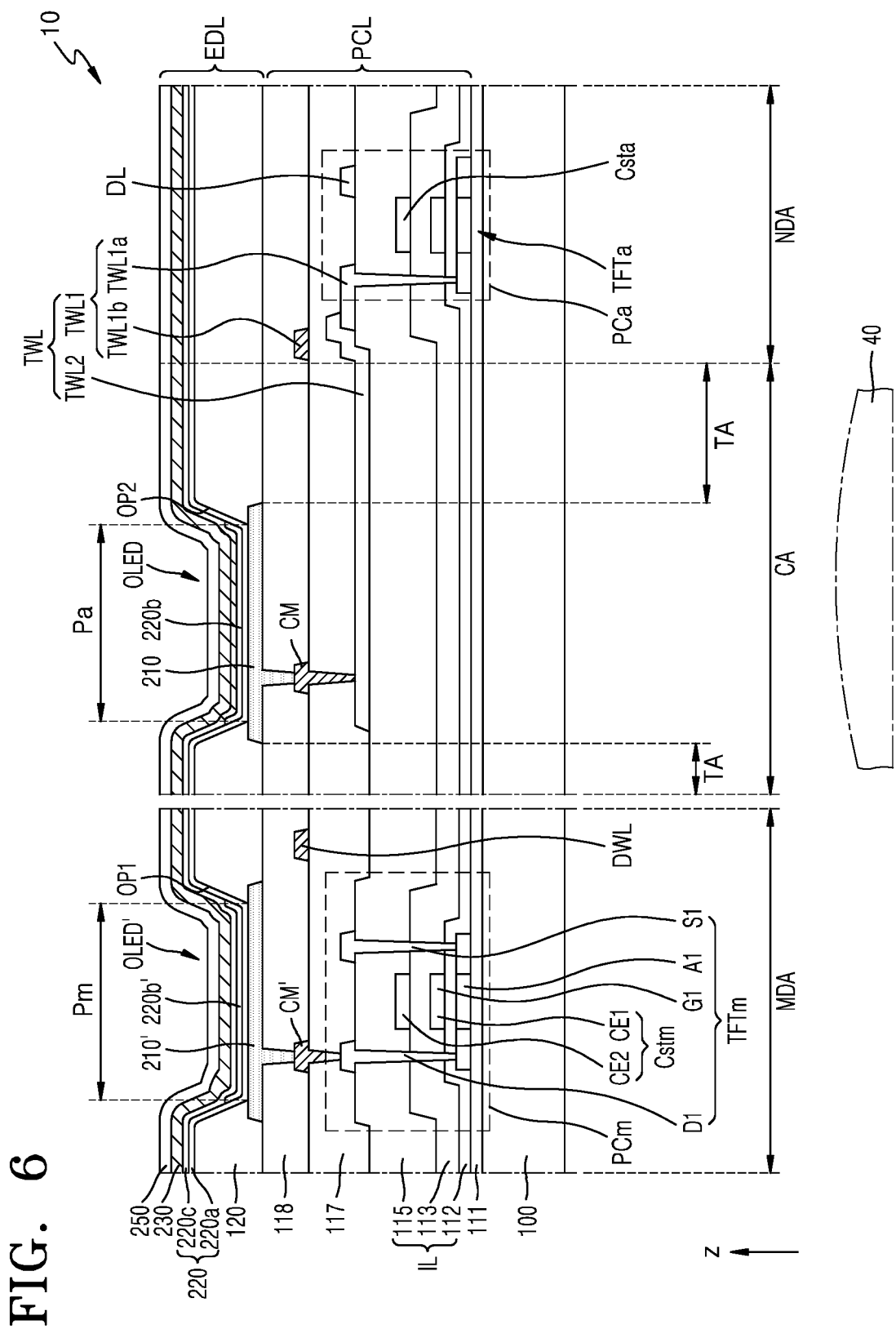
FIG. 6 is a schematic cross-sectional view of a portion of a display apparatus according to an embodiment.

FIG. 6 is a schematic cross-sectional view of a portion of a display apparatus, according to an embodiment.

FIG. 6 is a schematic cross-sectional view of a portion of the display panel 10 according to an embodiment. It is noted that the cross-sectional view schematically illustrates a portion of the main display area MDA, the component area CA, and the peripheral area NDA.

Referring to FIG. 6, a main subpixel Pm is arranged in the main display area MDA, and the component area CA includes an auxiliary subpixel Pa and a transmission area TA. A main pixel circuit PCm including a main thin-film transistor TFTm and a main storage capacitor Cstm, and a main organic light-emitting diode OLED' as a display element connected to the main pixel circuit PCm may be arranged in the main display area MDA. An auxiliary organic light-emitting diode OLED may be arranged in the component area CA. An auxiliary pixel circuit PCa including an auxiliary thin-film transistor TFTa and an auxiliary storage capacitor Csta may be arranged in the peripheral area NDA. Moreover, a connection line TWL connecting the auxiliary pixel circuit PCa and the auxiliary organic light-emitting diode OLED may be arranged in the component area CA and the peripheral area NDA.

Hereinbelow, a structure in which the elements included in the display panel 10 are stacked will be described. The display panel 10 may include a substrate 100, a buffer layer 111, a circuit layer PCL, and a display element layer EDL that are stacked.

The substrate 100 may include an insulating material, such as at least one of glass, quartz, and a polymer resin. The substrate 100 may include at least one of a rigid substrate and a flexible substrate that is, for instance, bendable, foldable, or rollable.

The buffer layer 111 may be positioned over the substrate 100 to reduce or block penetration of foreign materials, moisture, or external air from under the substrate 100 and may provide a flat surface over the substrate 100. The buffer layer 111 may include an inorganic material, such as at least one of oxide or nitride, an organic material, and an organic/inorganic composite material and may include a single-layer or multi-layer structure of an inorganic material and an organic material. A barrier layer that blocks penetration of external air may be further included between the substrate 100 and the buffer layer 111. In an embodiment, the buffer layer 111 may include at least one of silicon oxide ($SiO_2$), silicon nitride ($SiN_x$), and silicon oxynitride (SiON).

The circuit layer PCL may be arranged on the buffer layer 111 and may include main and auxiliary pixel circuits PCm and PCa, a first gate insulating layer 112, a second gate insulating layer 113, an interlayer insulating layer 115, and first and second planarization layers 117 and 118. The main pixel circuit PCm may include the main thin-film transistor TFTm and the main storage capacitor Cstm, and the auxiliary pixel circuit PCa may include the auxiliary thin-film transistor TFTa and the auxiliary storage capacitor Csta.

The main thin-film transistor TFTm and the auxiliary thin-film transistor TFTa may be arranged over the buffer layer 111. The main thin-film transistor TFTm includes a semiconductor layer A1, a gate electrode G1, a source electrode S1, and a drain electrode D1. The main thin-film transistor TFTm may be connected to the main organic light-emitting diode OLED' to drive the main organic light-emitting diode OLED'. The auxiliary thin-film transistor TFTa may be connected to the auxiliary organic light-emitting diode OLED to drive the auxiliary organic light-emitting diode OLED. At least because the auxiliary thin-film transistor TFTa has a similar configuration to the main thin-film transistor TFTm, the description of the main thin-film transistor TFTm will be replaced by the description of the auxiliary thin-film transistor TFTa.

The semiconductor layer A1 may be arranged on the buffer layer 111 and may include polysilicon. In another embodiment, the semiconductor layer A1 may include amorphous silicon. In another embodiment, the semiconductor layer A1 may include an oxide of at least one of indium (In), gallium (Ga), stannum (Sn), zirconium (Zr), vanadium (V), hafnium (Hf), cadmium (Cd), germanium (Ge), chromium (Cr), titanium (Ti), and zinc (Zn). The semiconductor layer A1 may include a channel region, and a source region and a drain region doped with impurities.

The first gate insulating layer 112 may be arranged to cover the semiconductor layer A1. The first gate insulating layer 112 may include an inorganic insulating material, such as at least one of $SiO_2$, $SiN_x$, $SiO_xN_y$, $Al_2O_3$, $TiO_2$, $Ta_2O_5$, $HfO_2$, and $ZnO_2$. The first gate insulating layer 112 may include a single layer or multiple layers including the aforementioned inorganic insulating material(s).

The gate electrode G1 is arranged on the first gate insulating layer 112 to overlap the semiconductor layer A1. The gate electrode G1 may include at least one of molybdenum (Mo), aluminum (Al), copper (Cu), titanium (Ti), and the like, and may include a single layer or multiple layers. For example, the gate electrode G1 may include a single Mo layer.

The second gate insulating layer 113 may be arranged to cover the gate electrode G1. The second gate insulating layer 113 may include an inorganic insulating material, such as at least one of $SiO_2$, $SiN_x$, $SiO_xN_y$, $Al_2O_3$, $TiO_2$, $Ta_2O_5$, $HfO_2$, and $ZnO_2$. The second gate insulating layer 113 may include a single layer or multiple layers including the aforementioned inorganic insulating material(s).

An upper electrode CE2 of the main storage capacitor Cstm may be arranged on the second gate insulating layer 113.

In the main display area MDA, the upper electrode CE2 of the main storage capacitor Cstm may overlap the gate electrode G1 arranged thereunder. The gate electrode G1 and the upper electrode CE2 overlapping each other with the second gate insulating layer 113 therebetween may constitute the main storage capacitor Cstm. The gate electrode G1 may be a lower electrode CE1 of the main storage capacitor Cstm.

The upper electrode CE2 may include a single layer or multiple layers including Al, platinum (Pt), palladium (Pd), silver (Ag), magnesium (Mg), gold (Au), nickel (Ni), neodymium (Nd), iridium (Ir), Cr, calcium (Ca), Mo, Ti, tungsten (W), and/or Cu.

The interlayer insulating layer 115 may be formed to cover the upper electrode CE2. The interlayer insulating layer 115 may include at least one of $SiO_2$, $SiN_x$, $SiO_xN_y$, $Al_2O_3$, $TiO_2$, $Ta_2O_5$, $HfO_2$, and $ZnO_2$. The interlayer insulating layer 115 may include a single layer or multiple layers including the aforementioned inorganic insulating material(s).

The source electrode S1 and the drain electrode D1 may be arranged over the interlayer insulating layer 115. The source electrode S1 and the drain electrode D1 may include a conductive material including, for instance, at least one of Mo, Al, Cu, Ti, and the like and may include a single layer or multiple layers including the aforementioned material(s). For example, the source electrode S1 and the drain electrode D1 may include a multi-layer structure of Ti/Al/Ti.

The connection line TWL connected to the auxiliary pixel circuit PCa may be arranged on the interlayer insulating layer 115. The connection line TWL may extend from the peripheral area NDA to the component area CA to connect the auxiliary organic light-emitting diode OLED and the auxiliary pixel circuit PCa. Also, the data line DL may be arranged on the interlayer insulating layer 115.

In an embodiment, the connection line TWL may include a first connection line TWL1 and a second connection line TWL2.

The first connection line TWL1 may be arranged in the peripheral area NDA and connected to the auxiliary pixel circuit PCa, for example, the auxiliary thin-film transistor TFTa. The second connection line TWL2 may be connected to the first connection line TWL1 and may be arranged in the transmission area TA of the component area CA. The second connection line TWL2 may be arranged on the same layer as the first connection line TWL1 and may include a material different from that of the first connection line TWL1. An end of the second connection line TWL2 may cover an end of the first connection line TWL1.

In another embodiment, the first connection line TWL1 and the second connection line TWL2 may be arranged on different layers. In some embodiments, the first connection line TWL1 may be arranged on the interlayer insulating layer 115, such as illustrated in FIG. 6, while the second connection line TWL2 may be arranged on a first planarization layer 117. In this case, the first connection line TWL1 and the second connection line TWL2 may be connected to each other through a contact hole defined in the first planarization layer 117.

The first connection line TWL1 may include a conductive material including at least one of Mo, Al, Cu, Ti, and the like, and may include a single layer or multiple layers including the above-noted material(s). The first connection line TWL1 may include a $(1-1)^{st}$ connection line TWL1a and a $(1-2)^{nd}$ connection line TWL1b that are arranged on different layers. In an embodiment, the $(1-1)^{st}$ connection line TWL1a may be arranged on the same layer as the data line DL and may include the same material as the data line DL. The $(1-2)^{nd}$ connection line TWL1b and the $(1-1)^{st}$ connection line TWL1a may be arranged with the first planarization layer 117 therebetween. The $(1-2)^{nd}$ connection line TWL1b may be arranged on the first planarization layer 117, which is on the same layer as metal layers CM and CM'. In another embodiment, the $(1-2)^{nd}$ connection line TWL1b may be arranged on the same layer as the upper electrode CE2 or the lower electrode CE1 of the main storage capacitor Cstm.

The second connection line TWL2 may include a transparent conductive material. For example, the connection line TWL may include a transparent conductive oxide (TCO). The connection line TWL may include a conductive oxide, such as at least one of indium tin oxide (ITO), indium zinc oxide (IZO), zinc oxide (ZnO), indium oxide ($In_2O_3$), indium gallium oxide (IGO), and aluminum zinc oxide (AZO).

The first connection line TWL1 may have higher conductivity than the second connection line TWL2. Because the first connection line TWL1 is arranged in the peripheral area NDA, and thus, there is no need to secure light transmittance, the first connection line TWL1 may include a material having lower light transmittance and higher conductivity than the second connection line TWL2. Accordingly, a resistance value of the connection line TWL may be minimized or at least reduced.

Planarization layers 117 and 118 may be arranged to cover the source electrode S1, the drain electrode D1, and the connection line TWL. The planarization layers 117 and 118 may have a flat upper surface so that a main pixel electrode 210' and an auxiliary pixel electrode 210 arranged thereon may be formed to be flat.

The planarization layers 117 and 118 may include an organic material or an inorganic material, and may have a single-layer structure or a multi-layer structure. The planarization layers 117 and 118 may include the first planarization layer 117 and the second planarization layer 118. Accordingly, a conductive pattern, such as a wire or the like, may be formed between the first planarization layer 117 and the second planarization layer 118, and thus, may be advantageous in high integration. Metal layers CM and CM' and the data connection line DWL may be arranged on the first planarization layer 117.

The first planarization layer 117 may include a general-purpose polymer (e.g., benzocyclobutene (BCB), polyimide, hexamethyldisiloxane (HMDSO), polymethylmethacrylate (PMMA), or polystyrene (PS)), a polymer derivative having a phenol-based group, an acrylic polymer, an imide-based polymer, an aryl ether-based polymer, an amide-based polymer, a fluorine-based polymer, a p-xylene-based polymer, or a vinyl alcohol-based polymer. Moreover, the first planarization layer 117 may include an inorganic insulating material, such as at least one of $SiO_2$, $SiN_x$, $SiO_xN_y$, $Al_2O_3$, $TiO_2$, $Ta_2O_5$, $HfO_2$, and $ZnO_2$. After the first planarization layer 117 is formed, chemical mechanical polishing may be performed on the upper surface thereof to provide the flat upper surface.

The first planarization layer 117 may be arranged to cover the main and auxiliary pixel circuits PCm and PCa. The second planarization layer 118 may be arranged on the first planarization layer 117 and may have a flat upper surface so that the auxiliary and main pixel electrodes 210 and 210' may be formed to be flat.

The auxiliary and main organic light-emitting diodes OLED and OLED' are arranged on the second planarization layer 118. The auxiliary and main pixel electrodes 210 and 210' of the auxiliary and main organic light-emitting diodes OLED and OLED' may be connected to the auxiliary and main pixel circuits PCa and PCm through the metal layers CM and CM' arranged on the first planarization layer 117.

The main pixel electrode 210' and the auxiliary pixel electrode 210 may include a conductive oxide, such as at least one of ITO, IZO, ZnO, $In_2O_3$, IGO, and AZO. The main pixel electrode 210' and the auxiliary pixel electrode 210 may include a reflective layer including at least one of Ag, Mg, Al, Pt, Pd, Au, Ni, Nd, Ir, and Cr, or any compound thereof. For example, the main pixel electrode 210' and the auxiliary pixel electrode 210 may have a structure including layers including ITO, IZO, ZnO, or $In_2O_3$ over and/or under the aforementioned reflective layer. In this case, the main pixel electrode 210' and the auxiliary pixel electrode 210 may have a stack structure of ITO/Ag/ITO.

A pixel-defining layer 120 may cover edges of each of the main pixel electrode 210' and the auxiliary pixel electrode 210 on the first planarization layer 117 and may include a first opening OP1 and a second opening OP2 that expose central portions of the main pixel electrode 210' and the auxiliary pixel electrode 210. Sizes and shapes of emission areas of the auxiliary and main organic light-emitting diodes OLED and OLED', e.g., the auxiliary and main subpixels Pa and Pm, are defined by the first opening OP1 and the second opening OP2.

The pixel-defining layer 120 may prevent an arc or the like from occurring at an edge of the pixel electrodes 210 and 210' by increasing a distance between the edge of the pixel electrodes 210 and 210' and an opposite electrode 230 above the pixel electrodes 210 and 210'. The pixel-defining layer 120 may include an organic insulating material, such as polyimide, polyamide, an acrylic resin, benzocyclobutene, hexamethyldisiloxane (HMDSO), and/or a phenol resin and may be formed by spin coating or the like.

A main emission layer 220b' and an auxiliary emission layer 220b formed to correspond to the main pixel electrode 210' and the auxiliary pixel electrode 210, respectively, are arranged in the first opening OP1 and the second opening OP2 of the pixel-defining layer 120. The main emission layer 220b' and the auxiliary emission layer 220b may include a polymer material or a low molecular weight material and may emit red, green, blue, or white light.

An organic functional layer 220 may be arranged over and/or under the main emission layer 220b' and the auxiliary emission layer 220b. The organic functional layer 220 may include a first functional layer 220a and/or a second functional layer 220c. The first functional layer 220a or the second functional layer 220c may be omitted.

The first functional layer 220a may be arranged under the main emission layer 220b' and the auxiliary emission layer 220b. The first functional layer 220a may include a single layer or multiple layers including an organic material. The first functional layer 220a may include a hole transport layer (HTL) having a single-layer structure. Alternatively, the first functional layer 220a may include a hole injection layer (HIL) and an HTL. The first functional layer 220a may be formed as one body to correspond to the auxiliary and main organic light-emitting diodes OLED and OLED' included in the main display area MDA and the component area CA.

The second functional layer 220c may be arranged on the main emission layer 220b' and the auxiliary emission layer 220b. The second functional layer 220c may include a single layer or multiple layers including an organic material. The second functional layer 220c may include an electron transport layer (ETL) and/or an electron injection layer (EIL). The second functional layer 220c may be formed as one body to correspond to the auxiliary and main organic light-emitting diodes OLED and OLED' included in the main display area MDA and the component area CA.

The opposite electrode 230 may be arranged on the second functional layer 220c. The opposite electrode 230 may include a conductive material having a low work function. For example, the opposite electrode 230 may include a (semi-)transparent layer including at least one of Ag, Mg, Al, Pt, Pd, Au, Ni, Nd, Ir, Cr, Li, and Ca, or any alloy thereof. Alternatively, the opposite electrode 230 may further include a layer including at least one of ITO, IZO, ZnO, and $In_2O_3$ on the (semi-)transparent layer including the above-noted material(s). The opposite electrode 230 may be formed as one body to correspond to the auxiliary and main organic light-emitting diodes OLED and OLED' included in the main display area MDA and the component area CA.

Layers from the main pixel electrode 210' to the opposite electrode 230 formed in the main display area MDA may constitute the main organic light-emitting diode OLED'. Layers from the auxiliary pixel electrode 210 to the opposite electrode 230 formed in the component area CA may constitute the auxiliary organic light-emitting diode OLED.

An upper layer 250 including an organic material may be formed on the opposite electrode 230. The upper layer 250 may be provided to protect the opposite electrode 230 and increase light extraction efficiency. The upper layer 250 may include an organic material having a refractive index higher than that of the opposite electrode 230. Alternatively, the upper layer 250 may include a stack of layers having different refractive indexes. For example, the upper layer 250 may include a stack of a high refractive index layer/a low refractive index layer/a high refractive index layer. In this case, a refractive index of the high refractive index layer may be about 1.7 or more, and a refractive index of the low refractive index layer may be about 1.3 or less. The upper layer 250 may further include lithium fluoride (LiF). In asome embodiments, the upper layer 250 may further include an inorganic insulating material, such as $SiO_2$ and/or $SiN_x$.

Hereinbelow, the shape and arrangement of the auxiliary subpixels Pa in the component area CA will be described with reference to FIGS. 7 to 17. In the following description, an "auxiliary pixel electrode" of the auxiliary subpixel Pa will be referred to as a "pixel electrode."

Figure 7:
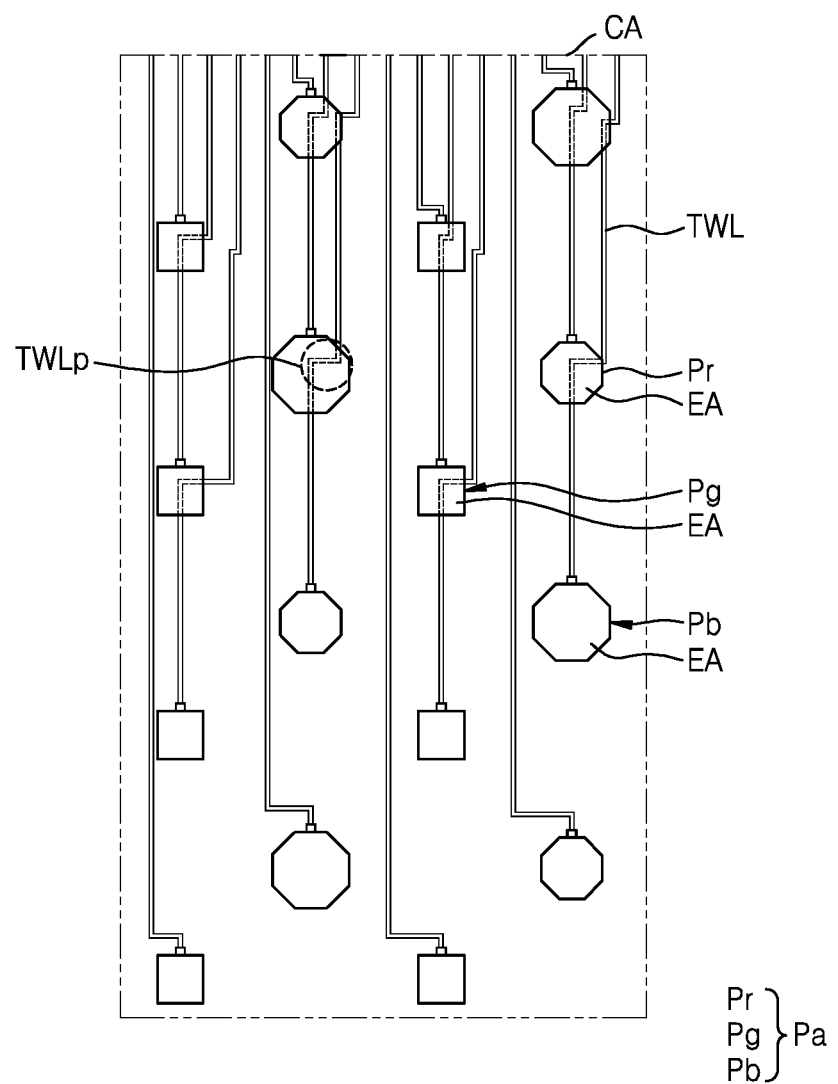
FIG. 7 is a schematic plan view of a portion of a component area of a display apparatus according to an embodiment.

FIG. 7 is a schematic plan view of a portion of a component area of a display apparatus according to an embodiment.

Referring to FIG. 7, the auxiliary subpixel Pa may include a red first subpixel Pr, a green second subpixel Pg, and a blue third subpixel Pb. Each of the first subpixel Pr, the second subpixel Pg, and the third subpixel Pb may be configured to receive a signal and power from the auxiliary pixel circuit PCa arranged on the peripheral area NDA described above through the connection line TWL. The first subpixel Pr, the second subpixel Pg, and third subpixel Pb illustrated in FIG. 7 may each represent an emission area EA.

In FIG. 7, the connection line TWL may be bent in at least some areas. A bent portion TWLp of the connection line TWL may overlap the emission area EA of each of the auxiliary subpixels Pa. As described above, the connection line TWL may be formed to include a light-transmitting conductive material, but light diffraction or reflection may partially appear by the bent portion TWLp of the connection line TWL in the component area CA. Accordingly, the bent portion TWLp of the connection line TWL is arranged to overlap the emission area EA of each of the auxiliary subpixels Pa, and thus, the above-noted problems may be minimized or at least reduced.

As illustrated in FIG. 7, the emission area EA of each of the auxiliary subpixels Pa may be variously provided in a rectangular shape, an octagonal shape, or the like. The emission area EA may be defined by an opening (e.g., the second opening OP2) through which a pixel-defining layer 120 exposes the pixel electrode 210 as described above with reference to FIG. 6, and the shape of the emission area EA may be different from the shape of the pixel electrode 210.

FIGS. 8 to 12 are plan views of an auxiliary subpixel of a display apparatus according to some embodiments.

FIGS. 8 to 12 illustrate various shapes of the pixel electrode 210 of the auxiliary subpixel Pa. The shape of the pixel electrode 210 illustrated in FIGS. 8 to 12 may be applied to all or some of the first subpixel PR, the second subpixel Pg, and the third subpixel Pb.

Referring to FIGS. 8 to 12, a pixel-defining layer 120 defining the emission area EA may be arranged on the pixel electrode 210. The pixel-defining layer 120 may include an opening 120op that covers an edge of the pixel electrode 210 and exposes a central portion thereof. In FIGS. 8 to 12, the opening 120op may correspond to the second opening OP2 of FIG. 6.

The pixel electrode 210 may include a contact portion CNT at one side thereof. The contact portion CNT is a portion where the auxiliary organic light-emitting diode OLED including the pixel electrode 210 is electrically connected to the auxiliary thin-film transistor TFTa, and in more detail, may refer to a portion where the pixel electrode 210 is connected to the connection line TWL. For example, when the pixel electrode 210 is directly connected to the connection line TWL, the contact portion CNT may be provided as a hole penetrating the first and second planarization layers 117 and 118 of FIG. 6. Also, when the pixel electrode 210 is connected to the connection line TWL through the metal layer CM, the contact portion CNT may be provided as a hole penetrating the second planarization layer 118 of FIG. 6.

The contact portion CNT may be positioned at an edge portion of the pixel electrode 210 covered by the pixel-defining layer 120. For instance, the contact portion CNT is not arranged in the emission area EA. When the contact portion CNT is formed in the emission area EA, the flatness of the emission area EA may be reduced, and thus, color distortion may occur. Accordingly, it is advantageous to secure an area sufficient to provide the contact portion CNT at the edge of the pixel electrode 210 covered by the pixel-defining layer 120.

Figure 8:
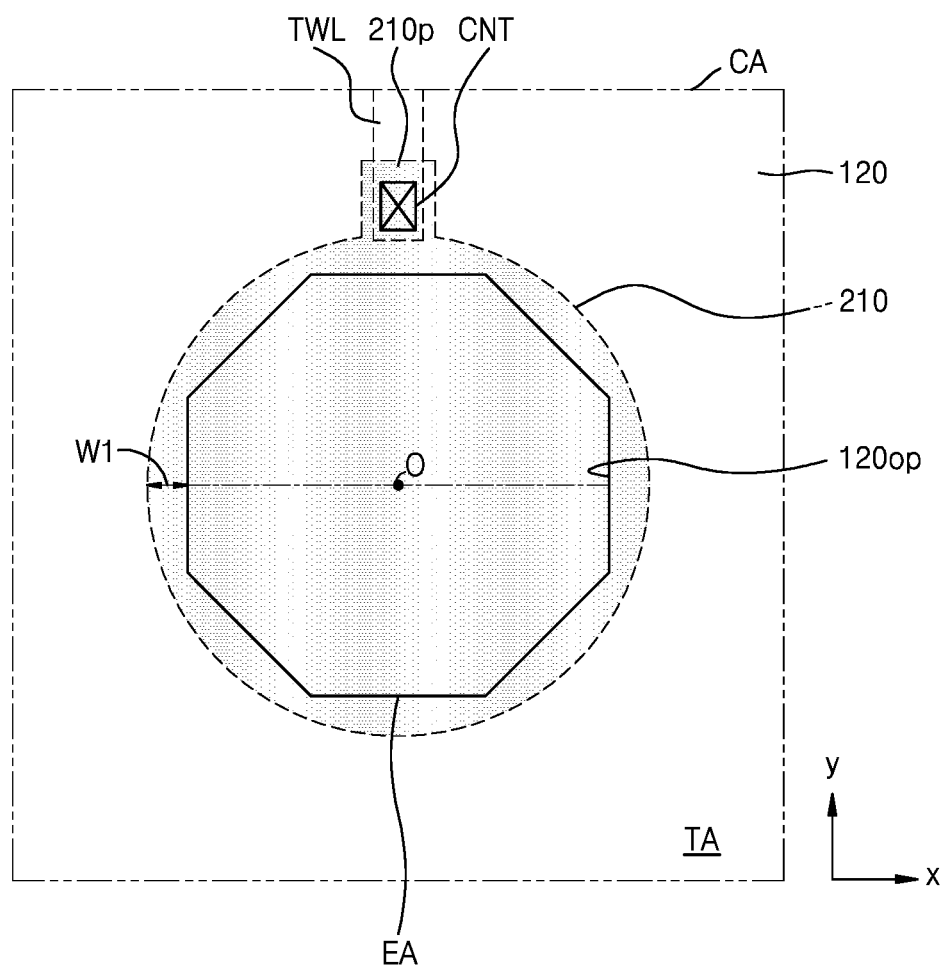
FIGS. 8, 10, 11, and 12 are plan views of an auxiliary subpixel of a display apparatus according to some embodiments.

Referring to FIG. 8, with respect to the shape of the pixel electrode 210, at least a portion of the pixel electrode 210 may have a round shape. In an embodiment, the pixel electrode 210 may have a substantially circular shape as illustrated in FIG. 8, but is not limited thereto.

The pixel electrode 210 may include at least one protrusion 210p at one side thereof. The contact portion CNT may be positioned in the protrusion 210p. FIG. 8 illustrates that one protrusion 210p is included, but a plurality of protrusions 210p may be included. Also, the protrusion 210p may have a rectangular shape protruding in one direction (e.g., the y-direction), but in another embodiment, the protrusion 210p may have a round shape or a sharp spine shape having one corner (or vertex). Because the protrusion 210p is positioned at one side of the pixel electrode 210, the pixel electrode 210 may have an asymmetric shape with respect to a center O of the emission area EA.

As described above, because the pixel electrode 210 has a substantially circular shape, an angular corner portion outside the pixel electrode 210 is reduced or removed in the component area, and thus, deterioration of display quality due to diffraction of reflected light may be prevented or minimized.

Figure 9A:
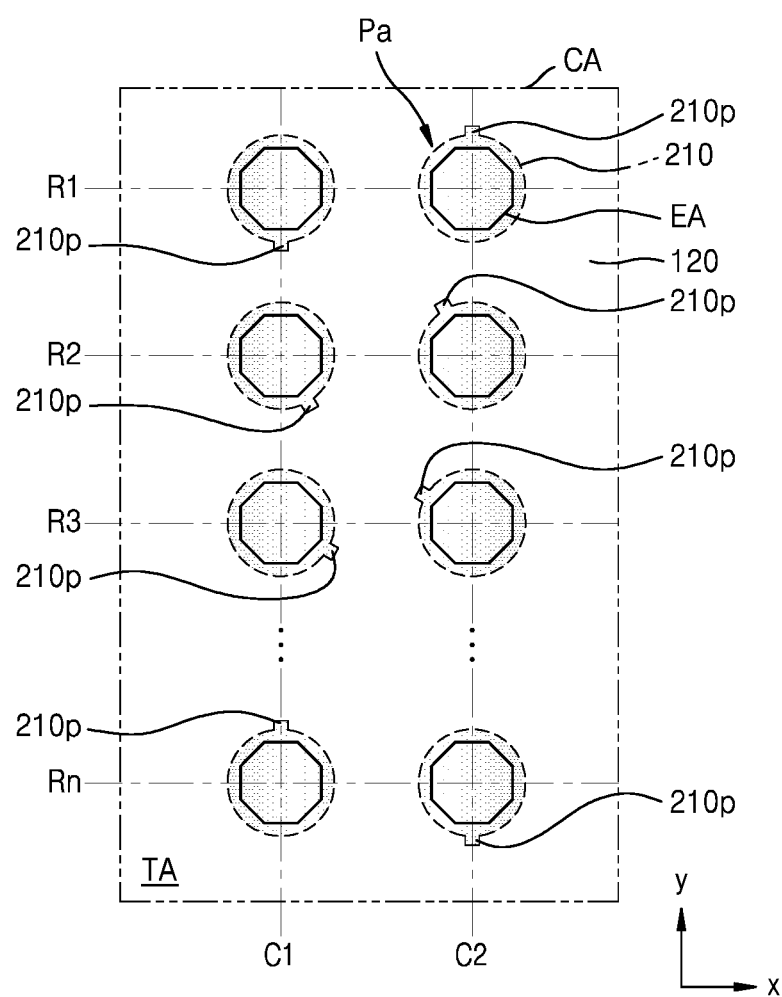
FIGS. 9A and 9B are plan views of an arrangement of auxiliary subpixels in a component area of a display apparatus according to some embodiments.
Figure 9B:
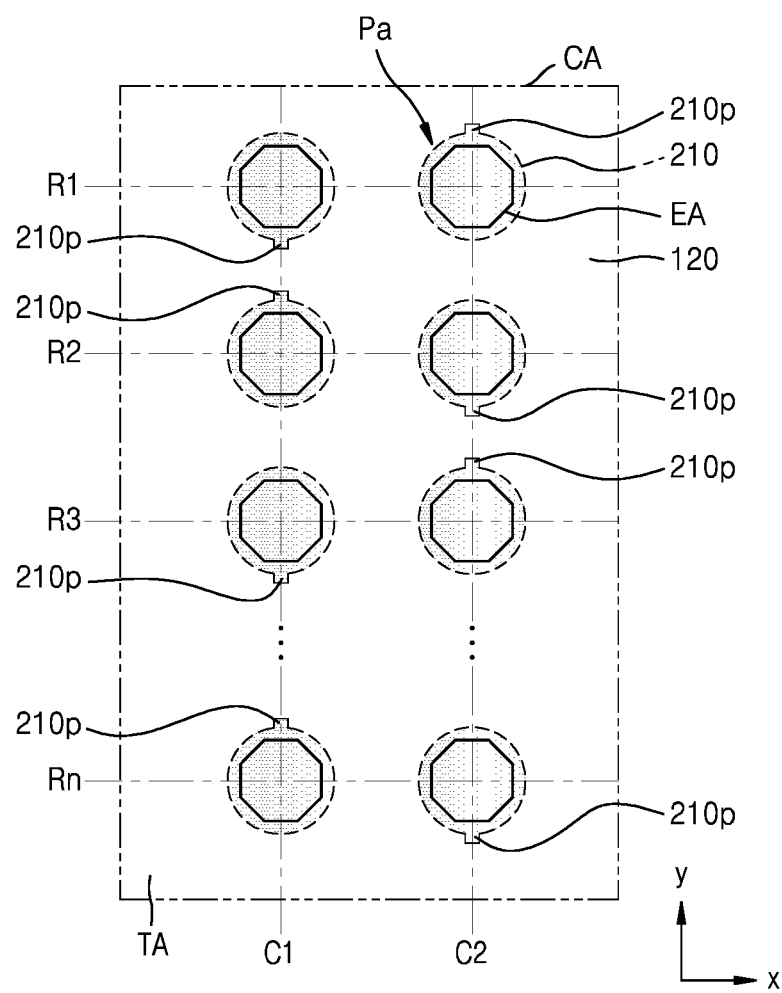

FIGS. 9A and 9B are plan views of an arrangement of auxiliary subpixels in a component area of a display apparatus according to some embodiments.

Referring to FIGS. 9A and 9B, it is illustrated that the pixel electrodes 210 of FIG. 8 are arranged in rows and columns in the component area CA. FIGS. 9A and 9B illustrate that the pixel electrodes 210 are arranged in a matrix form, but the pixel electrodes 210 may also be arranged in an oblique form, such as illustrated in FIGS. 5A and 5B.

First, referring to FIG. 9A, protrusions 210p of pixel electrodes 210 arranged in the same column C1 or C2 may be arranged in different directions. In an embodiment, the protrusions 210p of the pixel electrodes 210 arranged in the same column C1 or C2 may be arranged to be continuously rotated by a certain angle in a clockwise or counterclockwise direction.

For example, a protrusion 210p of a pixel electrode 210 arranged in the first column C1 and a first row R1 may be arranged in a −y direction, and then protrusions 210p of pixel electrodes 210 arranged in the −y direction may be arranged to be continuously rotated by a certain angle in the counterclockwise direction. In this case, the phrase "continuously rotated" may mean that, with respect to the protrusion 210p of the pixel electrode 210 arranged in the first column C1 and the first row R1, a protrusion 210p of a pixel electrode 210 arranged in the first column C1 and a second row R2 is rotated by about 30° and a protrusion 210p of a pixel electrode 210 arranged in the first column C1 and a third row R3 is rotated by about 60° so that the rotation angles form an arithmetic sequence. The rotation angles may be designated as angles between about 0° and 180° and may be set in consideration of the number of pixel electrodes 210 arranged in one column. For example, when n pixel electrodes 210 are arranged in the first column C1, a protrusion 210p of a pixel electrode 210 arranged in an n-th row Rn may be provided in a form rotated by 180° with respect to the protrusion 210p of the pixel electrode 210 arranged in the first row R1.

Also, in the first column C1 and the second column C2 that are adjacent to each other, protrusions 210p of pixel electrodes 210 arranged in the same row of the first and second columns C1 and C2 may be provided in a form rotated by 180°.

In FIG. 9B, similar to FIG. 9A, protrusions 210p of pixel electrodes 210 that are arranged in the same column C1 or C2 and adjacent to each other may be arranged in different directions. For example, in the same first column C1, protrusions 210p of pixel electrodes 210 arranged adjacent to each other may be provided in a form rotated by 180°. Also, in the first column C1 and the second column C2 that are adjacent to each other, the protrusions 210p of the pixel electrodes 210 arranged in the same row of the first and second columns C1 and C2 may be provided in a form rotated by 180°.

As described above, in FIGS. 9A and 9B, the protrusions 210p of the pixel electrodes 210 arranged in the same column C1 or C2 are arranged in different directions, and thus, diffraction due to light may be reduced compared to the protrusions arranged in one direction.

Figure 10:
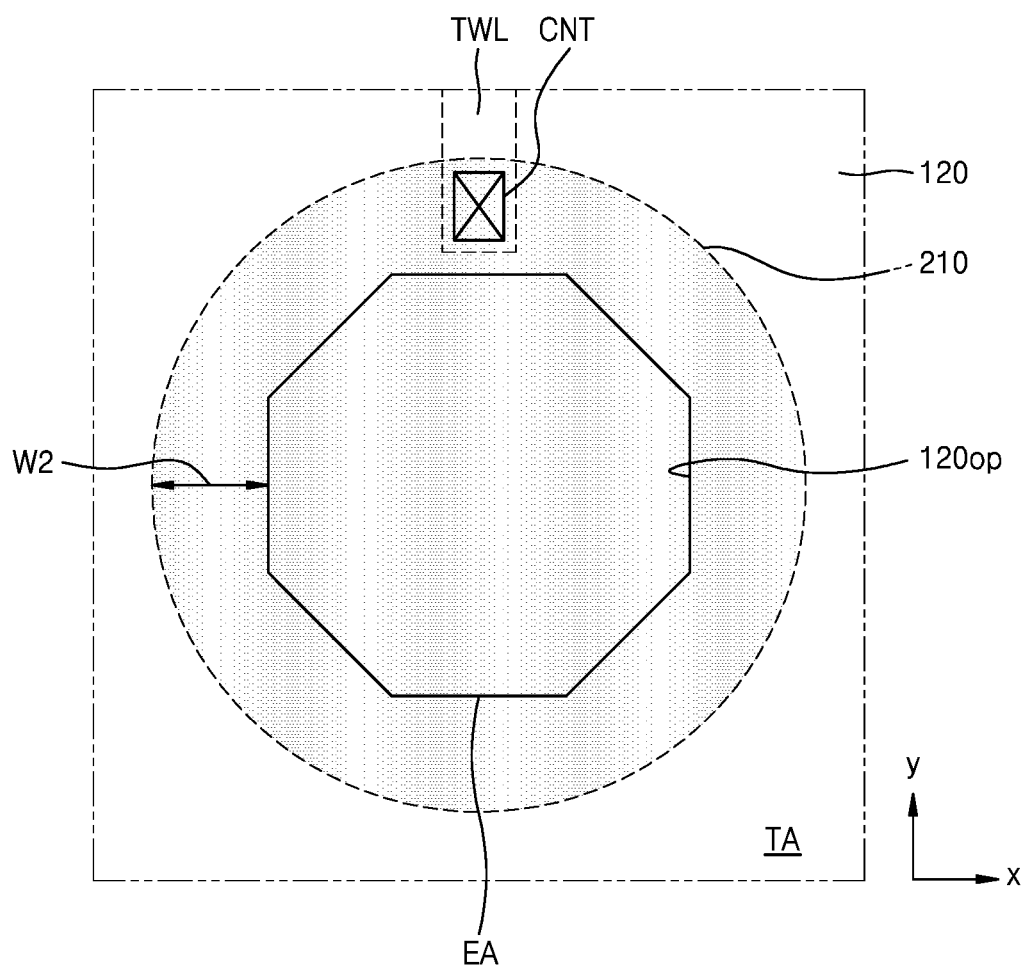
Figure 11:
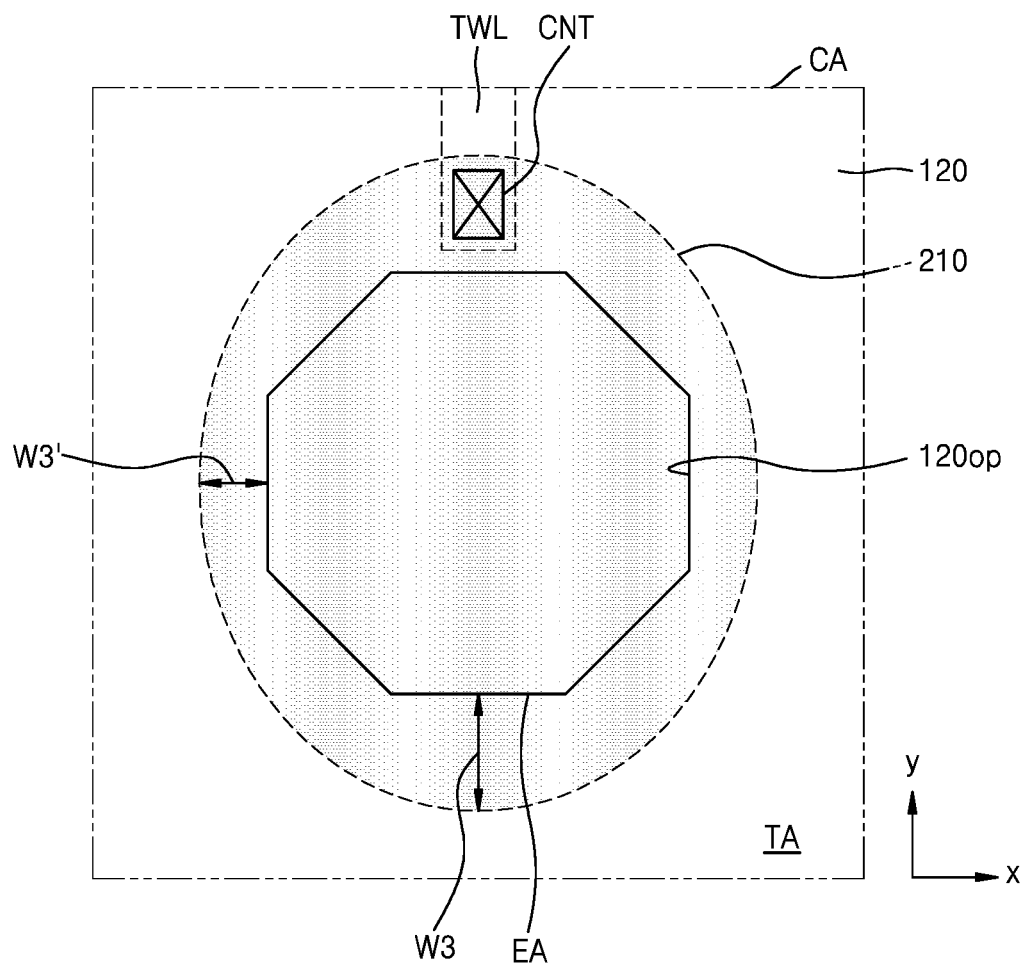
Figure 12:
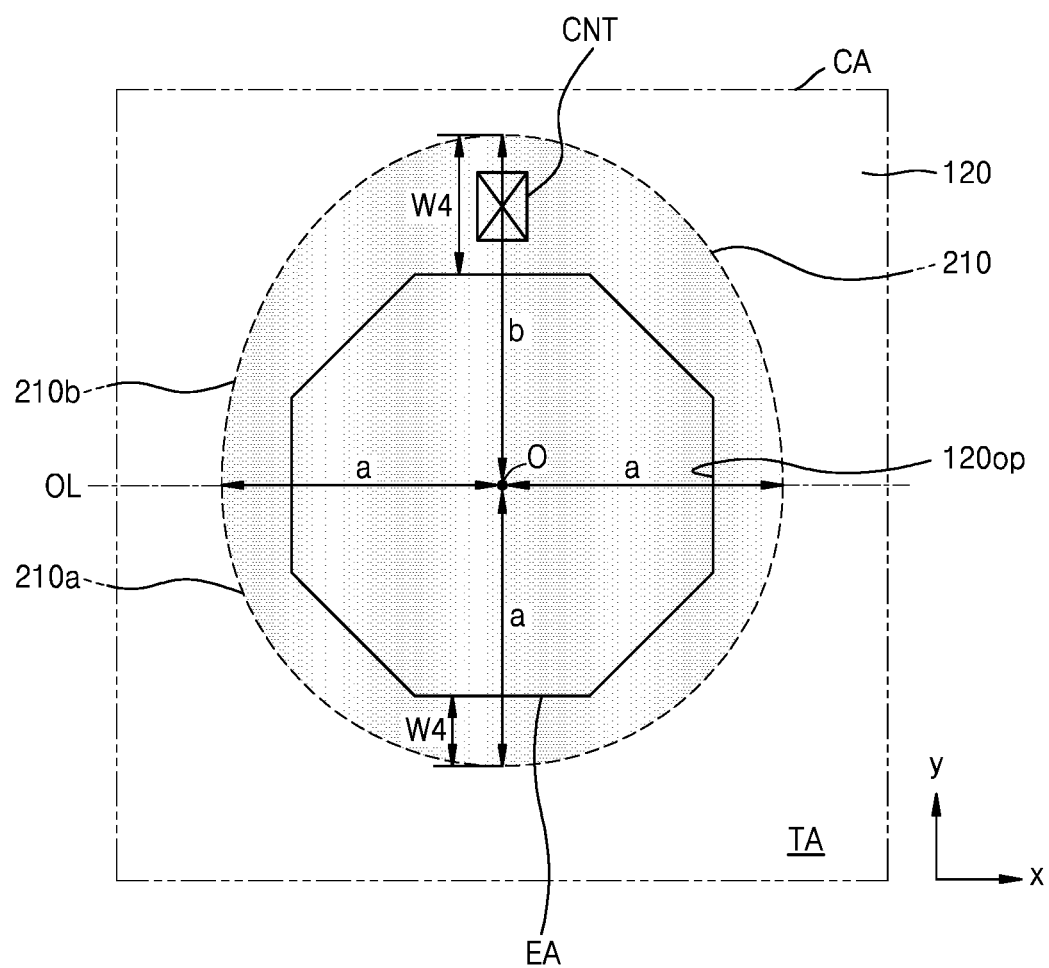

FIGS. 10 to 12 illustrate embodiments of the shape of the pixel electrode 210 according to some embodiments.

An outer portion of the pixel electrode 210 has a round shape and may have a circular shape as illustrated in FIG. 10 or may have an elliptical shape as illustrated in FIG. 11. The pixel electrode 210 does not include the protrusion 210p as illustrated in FIG. 8, and the outer portion of the pixel electrode 210 does not have angular corners such that deterioration of display quality due to diffraction of reflected light may be prevented, minimized, or at least reduced.

As illustrated in FIG. 10, when the pixel electrode 210 has a circular shape, the pixel electrode 210 may have a circular shape including a contact portion CNT provided at one side thereof. Accordingly, when it is assumed that the pixel electrode 210 include an emission area EA having the same area, a radius of the pixel electrode 210 of FIG. 10 may be greater than a radius of the pixel electrode 210 of FIG. 8. Therefore, in a width from an end of the opening 120op of the pixel-defining layer 120 defining the emission area EA to an end of the pixel electrode 210, that is, a width W1 or W2 of an area where the pixel electrode 210 is covered by the pixel-defining layer 120, the width W2 of the pixel electrode 210 of FIG. 10 may be greater than the width W1 of the pixel electrode 210 of FIG. 8. This may mean that, in each of the auxiliary subpixels Pa including an emission area EA having the same area, the area of the transmission area TA relatively reduces as the area of the pixel electrode 210 increases. This is because, unlike FIG. 8, the pixel electrode 210 of FIG. 10 does not include the protrusion 210p, and thus, the pixel electrode 210 needs to be formed to have a greater diameter to include the contact portion CNT.

In FIG. 11, because the pixel electrode 210 has an oval shape, a width (e.g., a long axis) in the y-axis direction may be maintained to be the same as that of the pixel electrode 210 of FIG. 10, and a width (e.g., a short axis) in the x-axis direction may be reduced. In FIG. 11, in widths W3 and W3' of an area where the pixel electrode 210 is covered by the pixel-defining layer 120, the width W3' in the x-axis direction may be less than the width W3 in the y-axis direction. Accordingly, because the area of the pixel electrode 210 is reduced by the width W3' in the x-axis direction in the pixel electrode 210 of FIG. 11 as compared with the width W3 in the y-axis direction, the area of the transmission area TA may be further enlarged while maintaining the area of the emission area EA.

Referring to FIG. 12, the outer portion of the pixel electrode 210 may have a round shape in which a circular shape and an elliptical shape are combined. The shape of the pixel electrode 210 of FIG. 12 may be defined as, for example, an egg shape. In some embodiments, the egg shape may mean that one side has a semicircular shape and the other side has a semi-elliptical shape. In FIG. 12, when it is assumed that there is a virtual line OL passing through the center O of the emission area EA (e.g., a center of a figure formed by the emission area EA), a first portion 210a of the pixel electrode 210 may have a partially circular shape, e.g., a semicircular shape, and a second portion 210b of the pixel electrode 210 may have a partially elliptical shape, e.g., a semi-elliptical shape.

In an embodiment, in a first direction (a +x direction), a second direction (a -x direction), a third direction (the -y direction), and a fourth direction (a +y direction) that are perpendicular to each other with respect to the center O of the emission area EA, one of widths in the first direction (the +x direction) to the fourth direction (the +y direction) from the center O of the emission area EA to the end of the pixel electrode 210 may be different from each other. In FIG. 12, widths a of radii of the pixel electrode 210 in the first direction (the +x direction), the second direction (the -x direction), and the third direction (the -y direction) with respect to the center O of the emission area EA may be the same. On the other hand, a width b of a radius of the pixel electrode 210 in the fourth direction (the +y direction) with respect to the center O of the emission area EA may be greater than the other widths a. Accordingly, in FIG. 12, in widths W4 and W4' of an area where the pixel electrode 210 is covered by the pixel-defining layer 120, the width W4' of the first portion 210a may be less than the width W4 of the second portion 210b.

The second portion 210b of the pixel electrode 210 may include the contact portion CNT. As described above, the width b of the pixel electrode 210 in the fourth direction (the +y direction) may be greater than the width a of the pixel electrode in the third direction (the -y direction). For instance, in the pixel electrode 210 of FIG. 12, at least because the second portion 210b including the contact portion CNT has an elliptical shape and the other first portion 210a has a circular shape, the area of the pixel electrode 210 may be reduced compared to the pixel electrode 210 of FIG. 11 in which the pixel electrode entirely has an elliptical shape, and the area of the transmission area TA may be further secured by the reduced area.

Figure 13:
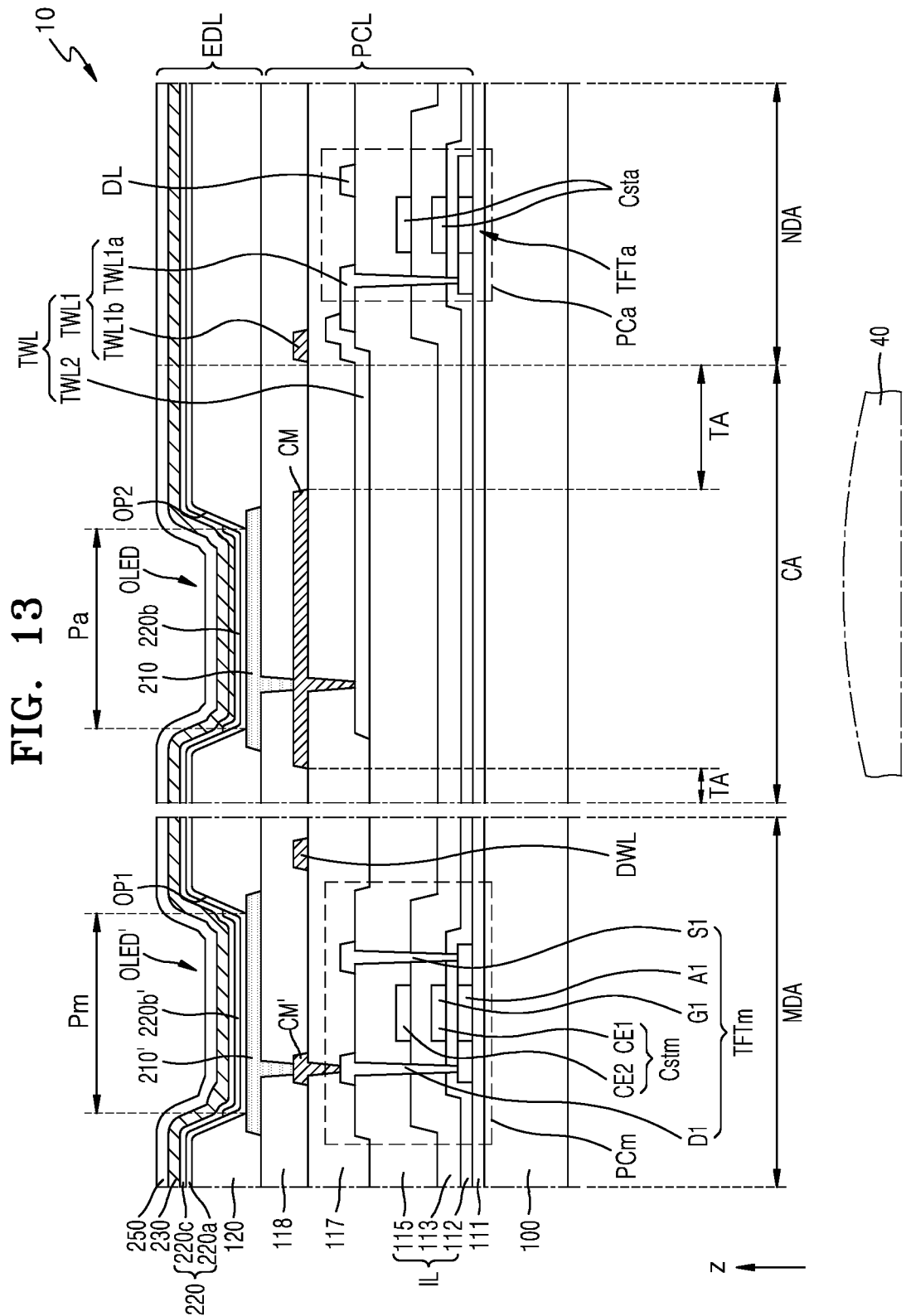
FIG. 13 is a schematic cross-sectional view of a portion of a display apparatus according to an embodiment.
Figure 14:
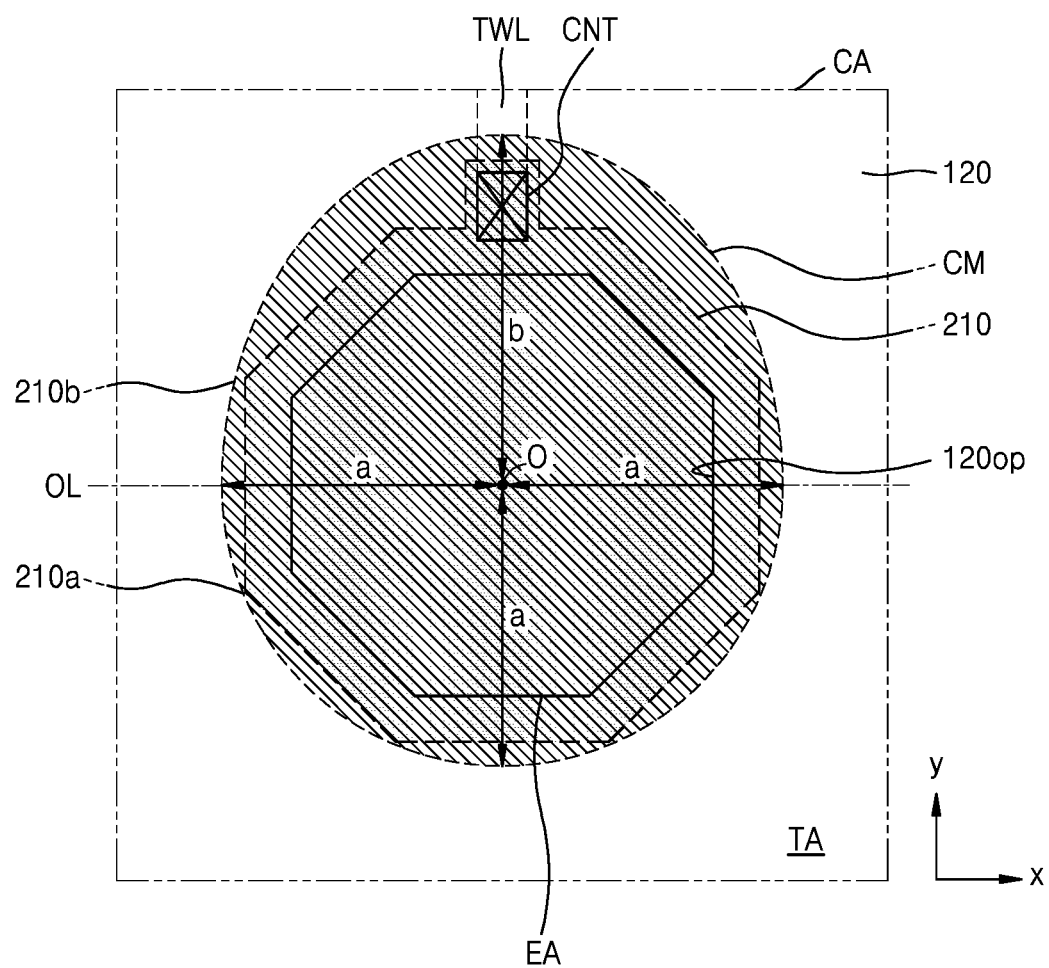
FIG. 14 is a plan view of an auxiliary subpixel of a display apparatus according to an embodiment.

FIG. 13 is a schematic cross-sectional view of a portion of a display apparatus according to an embodiment. FIG. 14 is a plan view of an auxiliary subpixel of a display apparatus according to an embodiment.

Referring to FIG. 13, the main display area MDA and the peripheral area NDA are the same as those described above with reference to FIG. 6, except for a structure on the component area CA. Referring to the component area CA of FIG. 13, the metal layer CM connecting the pixel electrode 210 to the connection line TWL may be provided to overlap the pixel electrode 210 on the front surface thereof. FIG. 13 illustrates that the metal layer CM is provided as a contact metal between the pixel electrode 210 and the connection line TWL to electrically connect the pixel electrode 210 to the connection line TWL, but is not limited thereto.

In an embodiment, at least a portion of the metal layer CM may have a round shape. As illustrated in FIG. 14, the metal layer CM may have a shape in which a circular shape and an elliptical shape are combined, for example, an egg shape. The metal layer CM may have a circular or elliptical shape as described above.

As an outer portion of the metal layer CM is formed in a round shape, the shape of the pixel electrode 210 may not be limited to a specific shape. For example, the pixel electrode 210 may have a polygonal shape similar to the shape of the emission area EA and may have a protrusion 210p at one side thereof. The contact portion CNT may be positioned in the protrusion 210p. As illustrated in FIG. 13, the pixel electrode 210 may be connected to the metal layer CM through the contact portion CNT, and the metal layer CM may be connected to the connection line TWL.

Referring to FIG. 14, the outer portion of the metal layer CM may have a round shape in which a circular shape and an elliptical shape are combined. The metal layer CM may be arranged to completely overlap the pixel electrode 210. An area in which the metal layer CM is arranged is a non-transmissive area, and as the metal layer CM completely overlaps the pixel electrode 210, diffraction of light passing through the component area CA may be minimized without limitation of the shape of the pixel electrode 210.

In FIG. 14, when it is assumed that there is a virtual line OL passing through the center O of the emission area EA (e.g., the center of the figure formed by the emission area EA), in the metal layer CM overlapping the pixel electrode 210, a first portion CMa may have a partially circular shape, e.g., a semicircular shape, and a second portion CMb may have a partially elliptical shape, e.g., a semi-elliptical shape.

In an embodiment, in the first direction (the +x direction), the second direction (the −x direction), the third direction (the −y direction), and the fourth direction (the +y direction) that are perpendicular to each other with respect to the center O of the emission area EA, one of widths in the first direction (the +x direction) to the fourth direction (the +y direction) from the center O of the emission area EA to an end of the metal layer CM may be different from each other. In FIG. 14, widths a of radii of the metal layer CM in the first direction (the +x direction), the second direction (the −x direction), and the third direction (the −y direction) with respect to the center O of the emission area EA may be the same. On the other hand, a width b of a radius of the metal layer CM in the fourth direction (the +y direction) with respect to the center O of the emission area EA may be greater than the other widths a.

The second portion CMb of the metal layer CM may be connected to the contact portion CNT of the pixel electrode 210. In the metal layer CM, the second portion CMb connected to the contact portion CNT of the pixel electrode 210 has an elliptical shape and the other first portion CMa has a circular shape, and thus, the area of the metal layer CM may be reduced compared to a case where the entire metal layer CM has an elliptical or circular shape, and the area of the transmission area TA may be further secured by the reduced area.

Figure 15:
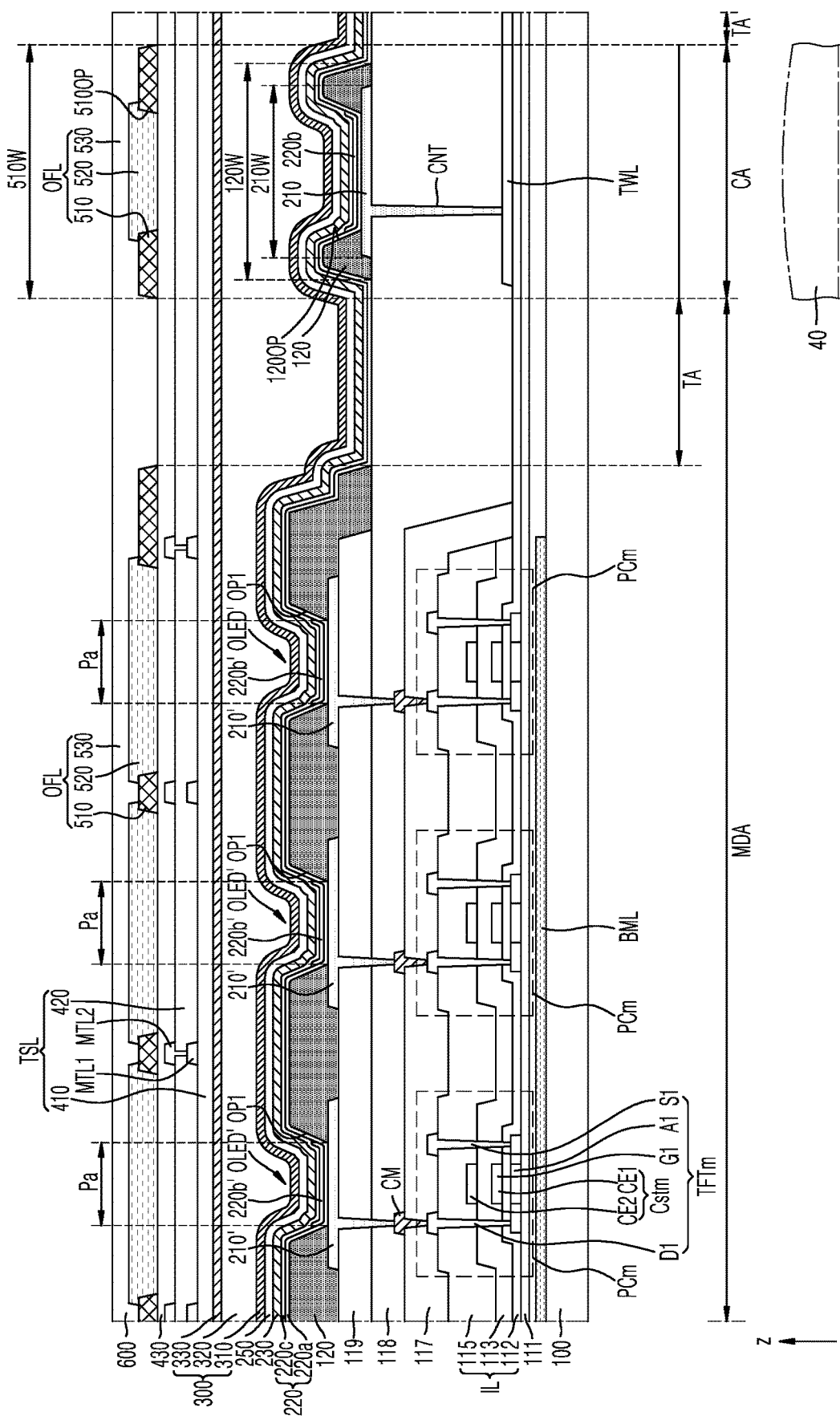
FIG. 15 is a schematic cross-sectional view of a portion of a display apparatus according to an embodiment.
Figure 16:
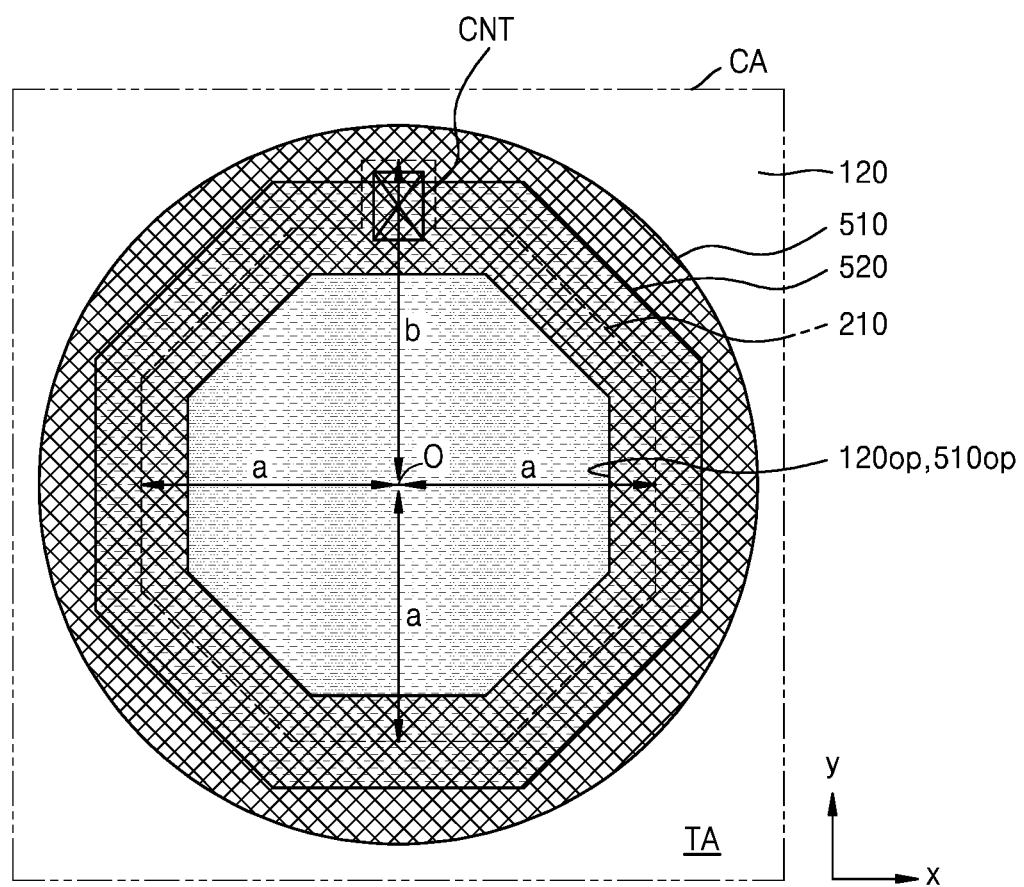
FIGS. 16 and 17 are plan views of an auxiliary subpixel of a display apparatus according to some embodiments.
Figure 17:
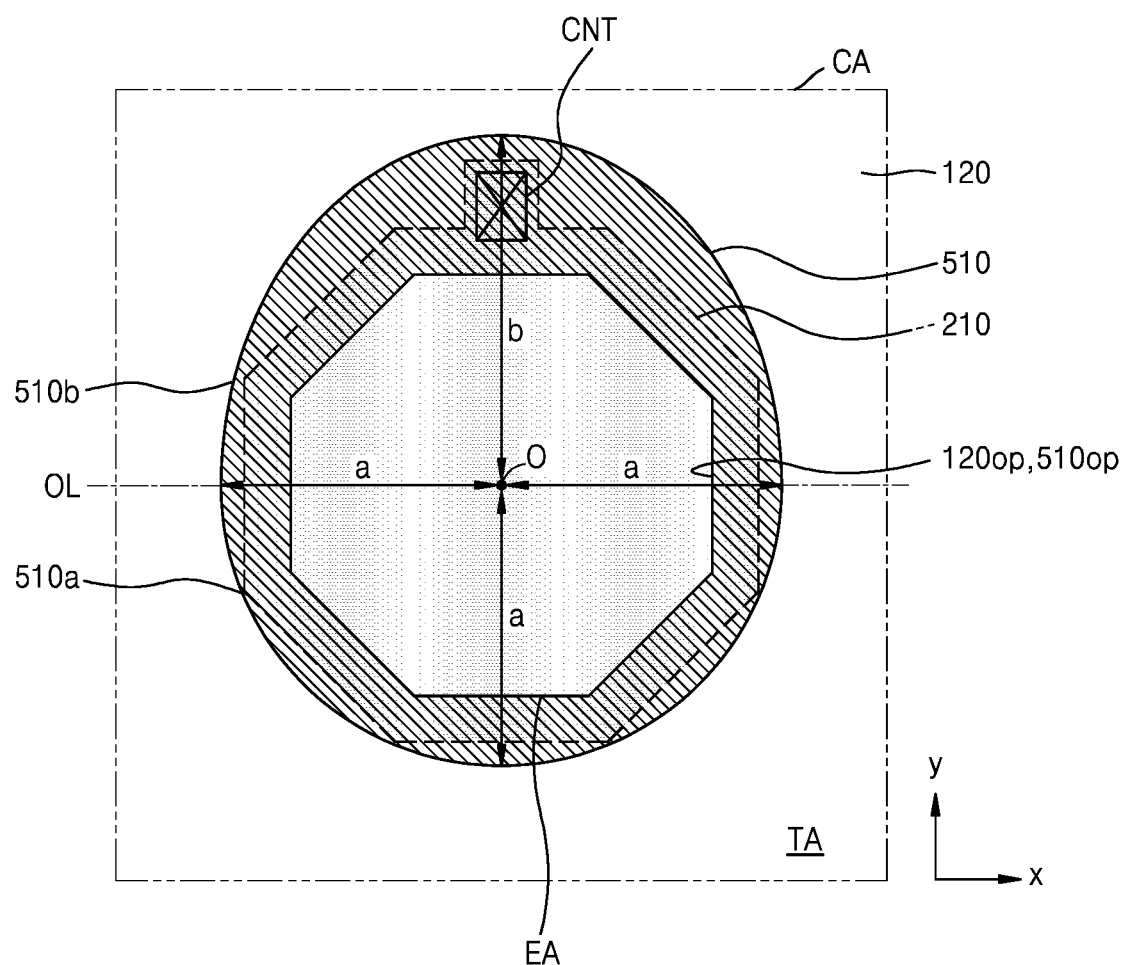

FIG. 15 is a schematic cross-sectional view of a portion of a display apparatus according to an embodiment. FIGS. 16 and 17 are plan views of an auxiliary subpixel of a display apparatus according to some embodiments.

Referring to FIG. 15, the display panel 10 is similar to the display panel of FIG. 6 described above, but a thin-film encapsulation layer 300, a touch screen layer TSL, and an optical functional layer OFL may be further arranged on the main subpixel Pm and the auxiliary subpixel Pa. For example, in an embodiment described in association with FIG. 15, it is illustrated that the optical functional layer OFL is provided as a filter plate including a black matrix 510-340 and color filters 520. The configurations of the main subpixel Pm and the auxiliary subpixel Pa are the same as those of FIG. 6 described above, and thus, further description thereof with respect to FIG. 15 is omitted. Hereinbelow, configurations of the thin-film encapsulation layer 300, the touch screen layer TSL, the optical functional layer OFL, and a configuration of the auxiliary subpixel Pa positioned in the component area CA will be described in more detail.

A thin-film encapsulation layer TFE may be arranged on the upper layer 250. The thin-film encapsulation layer TFE may include a first inorganic encapsulation layer 310, a second inorganic encapsulation layer 330, and an organic encapsulation layer 320 therebetween.

The first and second inorganic encapsulation layers 310 and 330 may each include one or more inorganic insulating materials. The inorganic insulating material may include aluminum oxide, titanium oxide, tantalum oxide, hafnium oxide, zinc oxide, silicon oxide, silicon nitride, and/or silicon oxynitride. The first and second inorganic encapsulation layers 310 and 330 may be formed by using a chemical vapor deposition method.

The organic encapsulation layer 320 may include a polymer-based material. The polymer-based material may include at least one of an acrylic resin, an epoxy-based resin, polyimide, and polyethylene. For example, the organic encapsulation layer 320 may include an acrylic resin, such as polymethyl methacrylate, polyacrylic acid, or the like. The organic encapsulation layer 320 may be formed by curing a monomer or applying a polymer.

An input sensing layer TSL may include a first conductive layer MTL1 and a second conductive layer MTL2 that include a sensing electrode and/or a trace line. A first insulating layer 410 may be between the thin-film encapsulation layer TFE and the first conductive layer MTL1, and a second insulating layer 420 may be between the first conductive layer MTL1 and the second conductive layer MTL2.

The first conductive layer MTL1 and the second conductive layer MTL2 may include a conductive material. The conductive material may include at least one of Mo, Al, Cu, Ti, and the like, and may include multiple layers or a single layer including the above-noted material(s). In an embodiment, the first conductive layer MTL1 and the second conductive layer MTL2 may have a structure in which a titanium layer, an aluminum layer, and a titanium layer are sequentially stacked (Ti/Al/Ti).

The first insulating layer 410 and the second insulating layer 420 may include an inorganic insulating material and/or an organic insulating material. The inorganic insulating material may include at least ones of silicon oxide, silicon oxynitride, silicon nitride, and the like. The organic insulating material may include an acrylic organic material and an imide-based organic material.

An optical functional layer OFL may be arranged on the input sensing layer TSL. The optical functional layer OFL may be directly arranged on the input sensing layer TSL or may be arranged after a third insulating layer 430 is placed therebetween, such as illustrated in FIG. 15.

The optical functional layer OFL may include a filter plate including a black matrix 510 and color filters 520, as illustrated in FIG. 15. The filter plate may include a black matrix 510, color filters 520, and an overcoat layer 530 covering the black matrix 510 and the color filters 520, which are arranged in each pixel. In another embodiment, the optical functional layer OFL may include an anti-reflective layer such as a polarizer, and in this case, the filter plate may be omitted. Because the anti-reflective layer such as the polarizer has a large thickness, there is a limitation in reducing the overall thickness of the display panel 10, and thus, when the filter plate is provided as illustrated in FIG. 15, a thickness of the display panel 10 may be effectively reduced.

The color filter 520 may be arranged on an emission area of the auxiliary subpixel Pa. The color filter 520 may have a red, green, or blue pigment or dye according to a color of light emitted from the auxiliary organic light emitting diode OLED.

The black matrix 510 may be positioned in a non-emission region and may surround the emission area. The black matrix 510 may include a through hole positioned in the transmission area TA. In an embodiment, the black matrix 510 may overlap a touch electrode of the input sensing layer TSL. For example, as illustrated in FIG. 14, the second conductive layer MTL2 of the input sensing layer TSL including the touch electrode may overlap the black matrix 510. The black matrix 510 may include an insulating material (e.g., an organic insulating material) including a black pigment or dye.

Moreover, in some embodiments, the pixel-defining layer 120 may include a light-shielding material. For example, the pixel-defining layer 120 may include an insulating material (e.g., an organic insulating material) including a black pigment or dye. As described above, the pixel-defining layer 120 provided as a light-shielding layer may prevent color mixing between adjacent pixels and may improve visibility by absorbing light reflected by the component 40 to the display panel 10.

Also, in some embodiments, a third planarization layer 119 is arranged on the second planarization layer 118 of the main display area MDA, and the main pixel electrode 210' is arranged on the third planarization layer 119, but embodiments are not limited thereto. Although it is illustrated that the third planarization layer 119 is arranged only in the main display area MDA for transmittance of the component area CA, the third planarization layer 119 may extend to the component area CA.

The auxiliary pixel electrode 210 (hereinafter, referred to as the pixel electrode 210) of the auxiliary subpixel Pa may be arranged in the component area CA. The pixel electrode 210 may be connected to the connection line TWL thereunder and may be electrically connected to the auxiliary pixel circuit PCa arranged in the peripheral area NDA such as illustrated in FIG. 6.

As described above, as the pixel-defining layer 120 includes the light-shielding material, the pixel-defining layer 120 arranged in the component area CA may be patterned and included for each auxiliary subpixel Pa. An area of the component area CA, in which the pixel electrode 210 and the pixel-defining layer 120 are not arranged, may function as the transmission area TA.

Similarly, the black matrix 510 arranged above the pixel electrode 210 may also be patterned to correspond to each auxiliary subpixel Pa. In some embodiments, a width 510W of the black matrix 510 may be greater than a width 210W of the pixel electrode 210 and a width 120W of the pixel-defining layer 120.

Referring to FIGS. 15 and 16 together, at least a portion of an outer portion of the black matrix 510 may have a round shape. The black matrix 510 may have a circular shape such as illustrated in FIG. 16 or may have an elliptical or egg shape as another example.

The black matrix 510 arranged above the pixel electrode 210 may completely overlap the pixel electrode 210, except for the emission area EA. For instance, as illustrated in FIG. 16, the black matrix 510 may include an opening 510op exposing the emission area EA. In FIG. 16, the opening 510op of the black matrix 510 has the same width as the opening 120op of the pixel-defining layer 120, but the opening 510op of the black matrix 510 may be formed to be larger than the opening 120op of the pixel-defining layer 120. The black matrix 510 may entirely overlap other areas of the pixel electrode 210 except for an area defined as the emission area EA. As described above, the black matrix 510 may cover an edge portion of the pixel electrode 210 to prevent, minimize, or at least reduce diffraction of light passing through the component area CA through an angular corner of the pixel electrode 210.

FIG. 17 illustrates that the black matrix 510 has an egg shape. Referring to FIG. 17, the outer portion of the black matrix 510 may have a round shape in which a circular shape and an elliptical shape are combined. The black matrix 510 may completely overlap other portions of the pixel electrode 210 except for the emission area EA. An area in which the black matrix 510 is arranged is a non-transmissive area, and as described above, because the width 510W of the black matrix 510 is greater than the width 210W of the pixel electrode 210 and the width 120W of the pixel-defining layer 120, the transmission area TA in the component area CA may be defined as an area in which the black matrix 510 is not arranged. Accordingly, diffraction of light passing through the component area CA may be minimized without limitation of the shape of the pixel electrode 210.

In FIG. 17, when it is assumed that there is a virtual line OL passing through the center O of the emission area EA (e.g., the center of the figure formed by the emission area EA), in the black matrix 510 overlapping the pixel electrode 210, a first portion 510a may have a partially circular shape, e.g., a semicircular shape, and a second portion 510b may have a partially elliptical shape, e.g., a semi-elliptical shape.

In an embodiment, in the first direction (the +x direction), the second direction (the −x direction), the third direction (the −y direction), and the fourth direction (the +y direction) that are perpendicular to each other with respect to the center O of the emission area EA, one of widths in the first direction (the +x direction) to the fourth direction (the +y direction) from the center O of the emission area EA to an end of the black matrix 510 may be different from each other. In FIG. 17, widths a of radii of the black matrix 510 in the first direction (the +x direction), the second direction (the −x direction), and the third direction (the −y direction) with respect to the center O of the emission area EA may be the same. On the other hand, a width b of a radius of the black matrix 510 in the fourth direction (the +y direction) with respect to the center O of the emission area EA may be greater than the other widths a.

The second portion 510b of the black matrix 510 may overlap the contact portion CNT of the pixel electrode 210. In the black matrix 510, the second portion 510b overlapping the contact portion CNT of the pixel electrode 210 has an elliptical shape and the other first portion 510a has a circular shape, and thus, the area of the black matrix 510 may be reduced compared to a case where the entire black matrix 510 has an elliptical or circular shape, and the area of the transmission area TA may be further secured by the reduced area.

Figure 18:
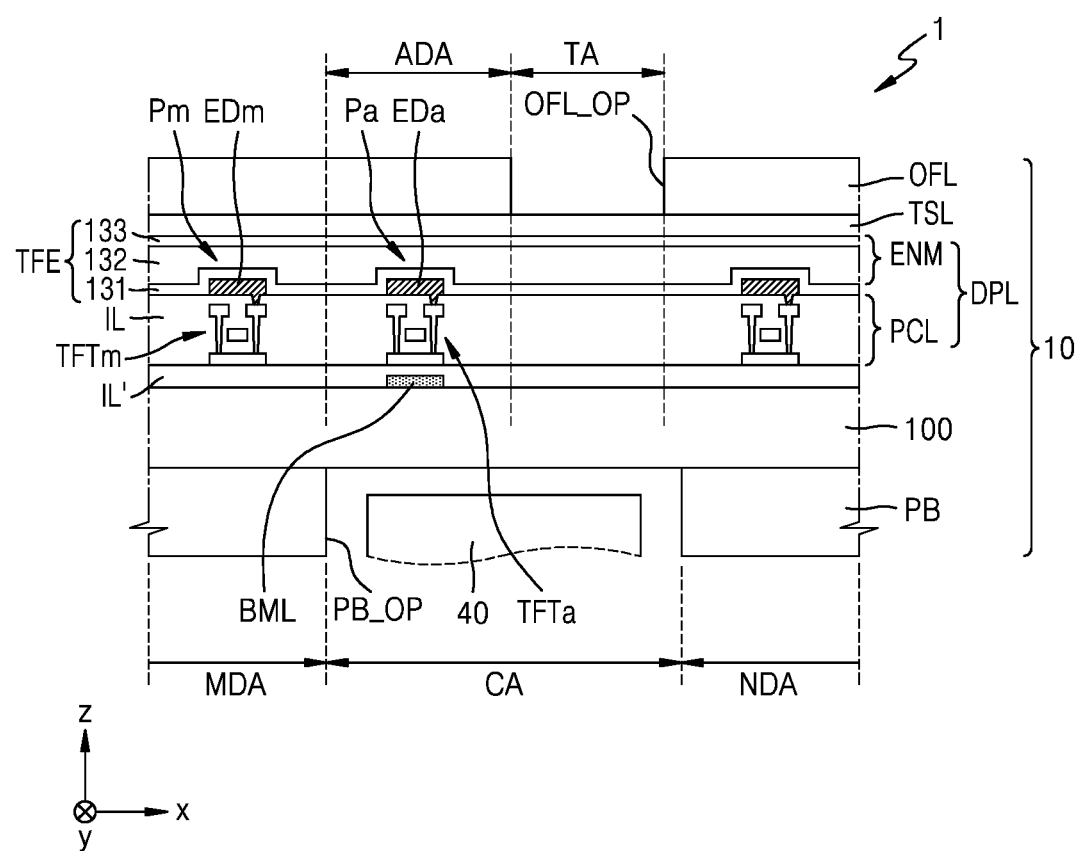
FIG. 18 is a schematic cross-sectional view of a portion of a cross-section of a display apparatus according to embodiment.
Figure 19:
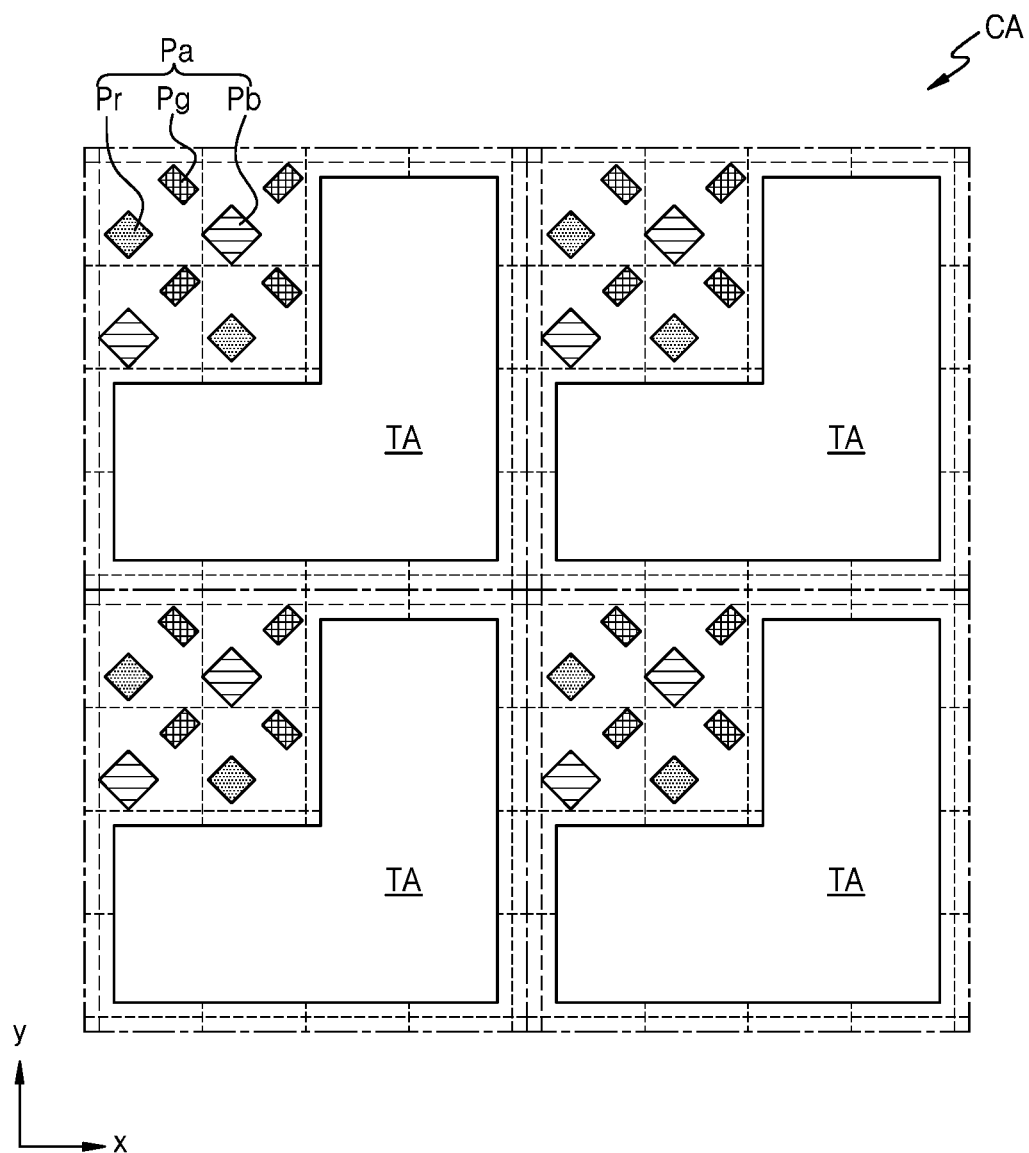
FIG. 19 is a schematic plan view of a portion of a component area of the display apparatus of FIG. 18 according to an embodiment.

FIG. 18 is a schematic cross-sectional view of a portion of a cross-section of a display apparatus according to an embodiment. FIG. 19 is a schematic plan view of a portion of a component area of the display apparatus of FIG. 18 according to an embodiment.

The display apparatus of FIG. 18 is substantially similar to the display apparatus described in association with FIG. 2, but is different from the display apparatus of FIG. 2 in that, in the auxiliary subpixel Pa, both an auxiliary display element EDa and an auxiliary pixel circuit PCa are arranged on the component area CA. In FIG. 2, only the auxiliary display element EDa is arranged on the component area CA, and the auxiliary pixel circuit PCa is arranged on the peripheral area NDA adjacent to the component area CA, whereas in FIG. 18, both the auxiliary display element EDa and the auxiliary pixel circuit PCa may be arranged on the component area CA. In this case, as illustrated in FIG. 19, the component area CA may separately include a portion of the transmission area TA in which the auxiliary subpixel Pa is not arranged.

The above-noted embodiments may be applied to the structure of the display apparatus illustrated in FIG. 18, as well as the structure of the display apparatus illustrated in FIG. 2.

According to various embodiments, a display apparatus in which quality of an image output through a component is improved while a high-quality image is provided may be implemented.

Although certain embodiments and implementations have been described herein, other embodiments and modifications will be apparent from this description. Accordingly, the inventive concepts are not limited to such embodiments, but rather to the broader scope of the accompanying claims and various obvious modifications and equivalent arrangements as would be apparent to one of ordinary skill in the art.

What is claimed is:

1. A display apparatus comprising:
a substrate comprising a main display area, a component area, and a peripheral area surrounding both the main display area and the component area in a view perpendicular to an upper surface of the substrate, the peripheral area being a non-display area;
a main pixel circuit and a main light-emitting element electrically connected to the main pixel circuit, the main pixel circuit and the main light-emitting element being disposed on the main display area;
an auxiliary light-emitting element disposed on the component area;
an auxiliary pixel circuit comprising an auxiliary thin film transistor disposed on the peripheral area; and
a connection line electrically connecting the auxiliary light-emitting element to the auxiliary pixel circuit,
wherein:
the auxiliary light-emitting element comprises an auxiliary pixel electrode,
in the view, a perimeter of the auxiliary pixel electrode is at least partially curved and has at most one line of symmetry; and
the auxiliary pixel electrode comprises a contact portion electrically connected to the connection line.

2. The display apparatus of claim 1, wherein, in the view:
a virtual line segment divides the auxiliary pixel electrode into a first portion and a second portion;
the first portion has a semicircular shape; and
the second portion has a semi-elliptical shape.

3. The display apparatus of claim 1, wherein, in the view:
a virtual curve divides the auxiliary pixel electrode into two portions; and
at least one of the two portions has an elliptical shape.

4. The display apparatus of claim 1, wherein, in the view:
a virtual curve divides the auxiliary pixel electrode into two portions; and
at least one of the two portions has a circular shape.

5. The display apparatus of claim 1, wherein, in the view, the auxiliary pixel electrode comprises:
a main body portion having one or more lines of symmetry; and
at least one protrusion extending from the main body portion.

6. The display apparatus of claim 5, wherein the contact portion is positioned in the at least one protrusion.

7. The display apparatus of claim 5, further comprising:
an other auxiliary pixel electrode disposed on the component area and adjacent to the auxiliary pixel electrode, the other auxiliary pixel electrode comprising:
an other main body portion having one or more lines of symmetry in the view; and
at least one other protrusion extending from the main body portion such that a perimeter of the other auxiliary pixel electrode has at most one line of symmetry,
wherein:
the at least one protrusion comprises a first protrusion extending in a first direction from the main body portion of the first auxiliary pixel electrode; and
the at least one other protrusion comprises a second protrusion extending in a second direction from the other main body portion of the other auxiliary pixel electrode, the second direction being different from the first direction.

8. The display apparatus of claim 7, wherein, in the view, the second direction is rotated by 180° with respect to the first direction.

9. The display apparatus of claim 7, further comprising:
a further auxiliary pixel electrode disposed on the component area, the further auxiliary pixel electrode comprising:
a further main body portion having one or more lines of symmetry in the view, and
at least one further protrusion extending from the further main body portion such that a perimeter of the further auxiliary pixel electrode has at most one line of symmetry,
wherein:
in the view, the further auxiliary pixel electrode is arranged in a same column as both the auxiliary pixel electrode and the other auxiliary pixel electrode;
the at least one further protrusion comprises a third protrusion extending from the further main body portion of the further auxiliary pixel electrode in a third direction different from both the first direction and the second direction; and
an angular pitch between the first protrusion; and the second protrusion is equivalent to an angular pitch between the second protrusion; and the third protrusion.

10. The display apparatus of claim 1, further comprising:
a pixel-defining layer comprising an opening exposing a central portion of the auxiliary pixel electrode,
wherein:
an emission area of the light-emitting element corresponds with the opening; and
in the view, the opening has a polygonal shape.

11. The display apparatus of claim 10, wherein, in the view:
a first virtual distance is defined between a center of the emission area and a first point on the perimeter of the auxiliary pixel electrode;
a second virtual distance is defined between the center of the emission area and a second point on the perimeter of the auxiliary pixel electrode;
a third virtual distance is defined between the center of the emission area and a third point on the perimeter of the auxiliary pixel electrode;
a fourth virtual distance is defined between the center of the emission area and a fourth point on the perimeter of the auxiliary pixel electrode;
the first point, the second point, the third point, and the fourth point are different from each other; and
the first virtual distance is different from each of the second virtual distance, the third virtual distance, and the fourth virtual distance.

12. The display apparatus of claim 10, wherein, in the view:
a virtual line segment divides the auxiliary pixel electrode into two portions,
a first portion among the two portions has a semicircular shape;
a center of the emission area is a center of a virtual circle, a perimeter of the virtual circle comprising each of the second point, the third point and the fourth point; and
the semicircular shape is inscribed by the virtual circle.

13. A display apparatus comprising:
a substrate comprising a main display area, a component area, and a peripheral area surrounding both the main display area and the component area in a view perpendicular to an upper surface of the substrate, the peripheral area being a non-display area;
a main pixel circuit and a main light-emitting element electrically connected to the main pixel circuit, the main pixel circuit and the main light-emitting element being disposed on the main display area;
an auxiliary light-emitting element disposed on the component area, the auxiliary light-emitting element comprising an auxiliary pixel electrode;
an auxiliary pixel circuit comprising an auxiliary thin film transistor disposed on the peripheral area;
a connection line electrically connecting the auxiliary light-emitting element to the auxiliary pixel circuit; and
a metal layer between the substrate and the auxiliary light-emitting element, the metal layer overlapping the auxiliary light-emitting element in the view,
wherein, in the view, the metal layer has an oval shape.

14. The display apparatus of claim 13, wherein, in the view a perimeter of the auxiliary pixel electrode is circumscribed within a perimeter of the metal layer.

15. The display apparatus of claim 13, wherein:
the auxiliary pixel electrode comprises:
a main body portion, and
at least one protrusion extending from the main body portion; and
in the view, the metal layer overlaps the at least one protrusion.

16. The display apparatus of claim 13, wherein, in the view the oval shape is an elliptical shape.

17. The display apparatus of claim 13, wherein, in the view the oval shape is a circular shape.

18. The display apparatus of claim 13, wherein, in the view:
a virtual line segment divides the oval shape into a first portion and a second portion;
the first portion has a semicircular shape; and
the second portion has a semi-elliptical shape.

19. The display apparatus of claim 18, wherein, in the view:
a virtual circle inscribes the semicircular shape;
a first virtual distance is defined between a center of the virtual circle and a first point on a perimeter of the oval shape;
a second virtual distance is defined between the center of the virtual circle and a second point on the perimeter of the oval shape;
a third virtual distance is defined between the center of the virtual circle and a third point on the perimeter of the oval shape;
a fourth virtual distance is defined between the center of the virtual circle and a fourth point on the perimeter of the oval shape;

the first point, the second point, the third point, and the fourth point are different from each other; and
the first virtual distance is different from each of the second virtual distance the third virtual distance, and the fourth virtual distance.

20. The display apparatus of claim 13, wherein:
the auxiliary pixel circuit comprises a thin-film transistor, the thin film transistor comprising a semiconductor layer, a gate electrode, and an other electrode layer electrically connected to the semiconductor layer;
the connection line comprises:
a first connection line comprising:
a (1-1)-th portion extending from the other electrode in a same first layer as the other electrode; and
a (1-2)-th portion extending in a second layer different from the first layer; and
a second connection line electrically connecting the metal layer between the auxiliary light-emitting element and the (1-1)-th portion of the first connection line, a material of the second connection line being different from a material of the first connection line; and
the metal layer is formed in the second layer.

21. A display apparatus comprising:
a substrate comprising a main display area, a component area, and a peripheral area surrounding both the main display area and the component area in a view perpendicular to an upper surface of the substrate, the peripheral area being a non-display area;
a main pixel circuit and a main light-emitting element electrically connected to the main pixel circuit, the main pixel circuit and the main light-emitting element being disposed on the main display area;
an auxiliary light-emitting element disposed on the component area, the auxiliary light-emitting element comprising an auxiliary pixel electrode;
an auxiliary pixel circuit comprising an auxiliary thin film transistor disposed on the peripheral area;
a connection line electrically connecting the auxiliary light-emitting element to the auxiliary pixel circuit; and
an optical functional layer overlapping the main light-emitting element and the auxiliary light-emitting element in the view,
wherein:
the optical functional layer further comprises a black matrix and a color filter layer;
the black matrix comprises a first opening overlapping the auxiliary pixel electrode in the view;
the color filter layer is disposed in the first opening; and
in the view, an outer perimeter of the black matrix circumscribes the first opening and has an oval-round shape.

22. The display apparatus of claim 21, wherein, in the view the oval shape is an elliptical shape or and a circular shape.

23. The display apparatus of claim 21, wherein, in the view:
a virtual line segment divides the oval shape into dx a first portion and a second portion;
the first portion has a semicircular shape; and
of the second portion has a semi-elliptical shape.

24. The display apparatus of claim 21, further comprising:
a pixel-defining layer comprising a second opening exposing a central portion of the auxiliary pixel electrode, the first opening overlapping the second opening in the view, wherein the pixel-defining layer comprises a light-blocking material.

25. The display apparatus of claim 21, wherein:
the auxiliary pixel electrode comprises:
 a main body portion, and
 a protrusion extending from the main body portion; and
in the view, the black matrix overlaps the protrusion.

26. A display apparatus comprising:
a substrate comprising a main display area, a component area, and a peripheral area surrounding both the main display area and the component area in a view perpendicular to an upper surface of the substrate, the peripheral area being a non-display area;
a main pixel circuit and a main light-emitting element electrically connected to the main pixel circuit, the main pixel circuit and the main light-emitting element being disposed on the main display area;
an auxiliary light-emitting element disposed on the component area;
an auxiliary pixel circuit comprising an auxiliary thin film transistor disposed on the peripheral area; and
a connection line electrically connecting the auxiliary light-emitting element to the auxiliary pixel circuit,
wherein:
 the auxiliary light-emitting element comprises an auxiliary pixel electrode; and
 in the view, an outer perimeter portion of the auxiliary pixel electrode has a curved shape.

27. The display apparatus of claim 26, wherein, in the view, the outer perimeter of the auxiliary pixel electrode does not have a corner at which a straight line meets a straight line.

28. The display apparatus of claim 26, wherein:
in the view, the auxiliary pixel electrode has at most one line of symmetry; and
the auxiliary pixel electrode comprises a contact portion electrically connected with the connection line.

29. The display apparatus of claim 26, wherein, in the view, the auxiliary pixel electrode has a circular shape, an elliptical shape, or an oval shape comprising a semicircular portion and a semi-elliptical portion.

* * * * *